(12) United States Patent
Park

(10) Patent No.: US 11,437,598 B2
(45) Date of Patent: Sep. 6, 2022

(54) LIGHT EMITTING DIODE AND LIGHT EMITTING DEVICE INCLUDING THE SAME

(71) Applicant: LG DISPLAY CO., LTD., Seoul (KR)

(72) Inventor: Jae-Hyun Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 103 days.

(21) Appl. No.: 17/011,695

(22) Filed: Sep. 3, 2020

(65) Prior Publication Data

US 2021/0066638 A1 Mar. 4, 2021

(30) Foreign Application Priority Data

Sep. 4, 2019 (KR) .................. 10-2019-0109454

(51) Int. Cl.
| H01L 51/50 | (2006.01) |
| C09K 11/88 | (2006.01) |
| H01L 51/00 | (2006.01) |
| H01L 27/32 | (2006.01) |

(52) U.S. Cl.
CPC .......... H01L 51/5096 (2013.01); C09K 11/88 (2013.01); H01L 51/005 (2013.01); H01L 51/502 (2013.01); H01L 51/5004 (2013.01); H01L 27/3248 (2013.01); H01L 2251/552 (2013.01); H01L 2251/558 (2013.01)

(58) Field of Classification Search
CPC ............. H01L 51/5096; H01L 51/5004; H01L 51/005

See application file for complete search history.

(56) References Cited

U.S. PATENT DOCUMENTS

| 2008/0180020 A1 | 7/2008 | Cok |
| 2019/0081263 A1 | 3/2019 | Park et al. |
| 2019/0097151 A1 | 3/2019 | Lee et al. |
| 2019/0131557 A1* | 5/2019 | Lee .................. H01L 51/5096 |
| 2020/0266375 A1 | 8/2020 | Li et al. |

FOREIGN PATENT DOCUMENTS

| KR | 10-2019-0061746 A | 6/2019 |
| TW | M578879 U | 6/2019 |

OTHER PUBLICATIONS

First Examination Report dated Nov. 18, 2021, issued in corresponding Intellectual Property India No. 202014036350.
Office Action dated May 30, 2022, issued in corresponding Taiwanese Patent Application No. 109128832.

\* cited by examiner

*Primary Examiner* — Anthony Ho
(74) *Attorney, Agent, or Firm* — Morgan, Lewis & Bockius LLP

(57) ABSTRACT

The present disclosure relates to a light emitting diode (LED) that includes a charge control layer made of metal component and disposed between a first electrode and a second electrode and a light emitting device including the diode. Charges can be injected into an emitting material layer of the LED in a balanced manner, thus the luminous efficiency and a luminous lifetime of the LED and the light emitting device can be improved.

20 Claims, 12 Drawing Sheets

(DELETE)

LIGHT EMITTING DIODE AND LIGHT EMITTING DEVICE INCLUDING THE SAME

CROSS REFERENCE TO RELATED APPLICATION

This application claims the benefit under 35 U.S.C. § 119(a) of Korean Patent Application No. 10-2019-0109454, filed in the Republic of Korea on Sep. 4, 2019, which is incorporated herein by reference in its entirety.

BACKGROUND

Technical Field

The present disclosure relates to a light emitting diode, and more specifically, to a light emitting diode into which charges can be injected in balance and a light emitting device including the diode.

Discussion of the Related Art

As electronic and information technologies progress rapidly, a field of displays for processing and displaying a large quantity of information has been developed rapidly. Accordingly, various flat panel display devices have been widely used. Among the flat panel display devices, an organic light emitting diode (OLED) has come into spotlight. Since the OLED can be formed even on a flexible transparent substrate and has relatively lower power consumption, the OLED display device has attracted a lot of attention as a next-generation display device replacing LCD. However, in case of increasing current densities or raising driving voltages in the OLED for improving luminance in the OLED display device, the luminous lifetime of the OLED become shorter owing to thermal degradation and deteriorations of organic materials in the OLED.

Recently, a display device using inorganic luminescence particles such as quantum dot (QD) or quantum rod (QR) has been developed. QD or QR is an inorganic luminescence particle that emits light as unstable stated excitons shift from its conduction band to its valence band. QD or QR has large extinction coefficient, high quantum yield among inorganic particles and generates strong fluorescence. Besides, since QD or QR has different luminescence wavelengths as its sizes, it is possible to obtain light within the whole visible light spectra so as to implement various colors by adjusting sizes of QD or QR.

However, a quantum-dot light emitting diode (QLED) in which inorganic nano particle such as QD is introduced has shown very low luminous efficiency compared to the OLED. In addition, charges cannot be injected into an emitting material layer in balance and charges injected into the emitting material layer is leaked to adjacent layers in the OLED and QLED. Therefore, it is necessary to solve the disadvantages of reduced luminous efficiency and luminous lifetime due to the charge imbalance and charge leakage.

SUMMARY

Accordingly, embodiments of the present disclosure are directed to a light emitting diode and a light emitting device having the diode that substantially obviate one or more of the problems due to the limitations and disadvantages of the related art.

An object of the present disclosure is to provide a light emitting diode into which charges can be injected in balance and which minimize a charge leakage and a light emitting device including the diode.

Another object of the present disclosure is to provide a light emitting diode that improves its luminous efficiency and luminous lifetime and a light emitting device including the diode.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a light emitting diode (LED) comprises a first electrode; a second electrode facing the first electrode; an emitting material layer disposed between the first and second electrodes; and a charge control layer disposed between the emitting material layer and the second electrode, wherein the charge control layer comprises a metal.

The light emitting diode may further comprise a charge transfer layer, wherein the charge control layer prevents holes leaking into or trapping at the charge transfer layer from the emitting material layer.

Alternatively, the charge control layer is made of a metal.

The metal may comprise a post-transition metal, an alkali metal, an alkaline earth metal, a lanthanide metal and an actinide metal, alternatively, a Group 13 metal.

For example, the metal may comprise Al, Ga, In, Tl and combination thereof.

In one exemplary aspect, the charge control layer has a thickness between about 0.1 nm and about 10 nm.

The LED may further comprise a first charge transfer layer disposed between the first electrode and the emitting material layer and a second charge transfer layer disposed between the charge control layer and the second electrode.

The charge control layer may be further disposed between the second charge transfer layer and the emitting material layer The transfer layer comprises an inorganic material, for example without limitation, a metal oxide. The second charge transfer layer has a valence band energy level deeper than a valence band energy level of the emitting material layer.

As an example, the emitting material layer may comprise an inorganic luminescence particle such as a quantum dot, a quantum rod and combination thereof. For example, the inorganic luminescence particle comprises a core, a shell enclosing the core and a first ligand bound to a surface of the shell. The emitting material layer may further comprise a second ligand free from the inorganic luminescence particle.

The metal may interact with the first ligand, for example, the first ligand may be coordinated with the metal.

In one exemplary aspect, the first ligand may comprise an organic ligand having a negative charge. In this case, the organic ligand may comprise at least one negatively charged group of a carboxylate group, a phosphonate group and a thiolate group in at least one terminus thereof.

Alternatively, the ligand comprises an organic ligand having lone pair electrons. In this case, the organic ligand may comprise at least one of an amino group, a thiol group, a phosphine group and a phosphine oxide group in at least one terminus thereof.

In another aspect, a light emitting device comprises a substrate and the light emitting diode disposed over the substrate, as described above.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate implementations of the disclosure and together with the description serve to explain principles of the disclosure.

Each of FIGS. 16 to 18 is a graph illustrating XPS analysis result for a double-layered thin film where metal film is coated on a QD film and shows an interaction between the metal and oxygen in the ligand.

DETAILED DESCRIPTION

Reference will now be made in detail to aspects of the disclosure, examples of which are illustrated in the accompanying drawing.

[Light Emitting Device]

Figure 1:
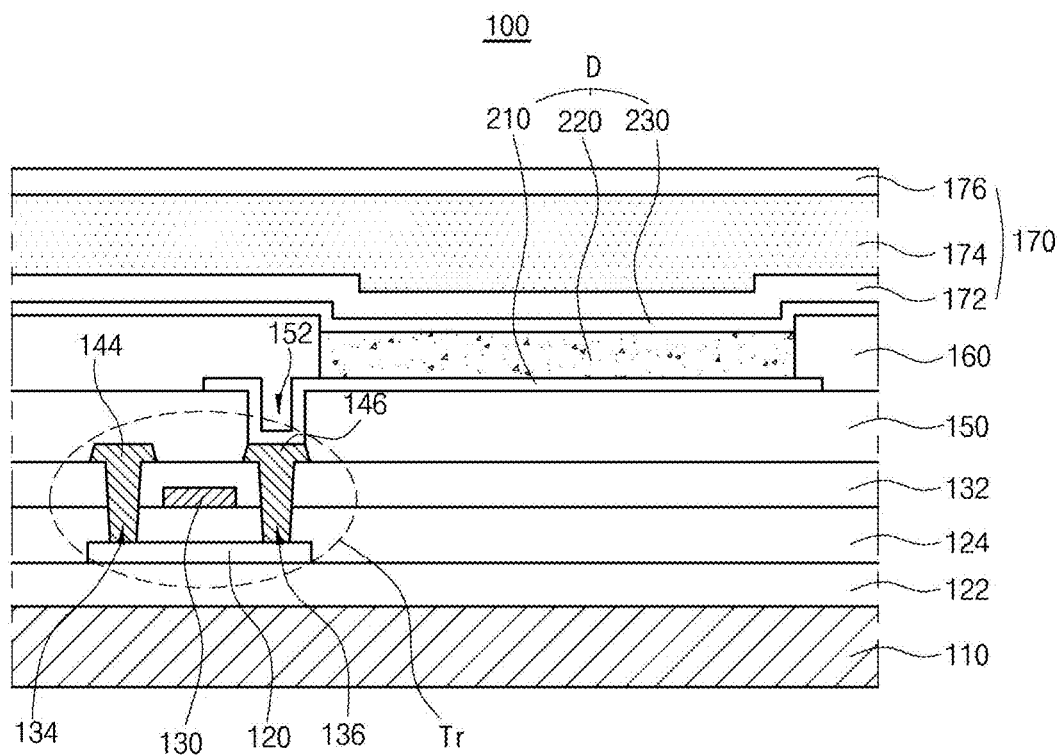
FIG. 1 is a schematic cross-sectional view illustrating a light emitting display device in accordance with the present disclosure.

The present disclosure relates to a light emitting diode (LED) that introduces a charge control layer (CCL) made of a metal component and disposed between an emitting material layer (EML) and a charge transfer layer (CTL), and a light emitting device having the LED. The LED may be applied to a light emitting device such as a light emitting display device and a light emitting diode illumination device. FIG. 1 is a schematic cross-sectional view illustrating a light emitting display device in accordance with the present disclosure.

As illustrated in FIG. 1, a light emitting display device 100 includes a substrate 110, a thin film transistor Tr over the substrate 110 and a light emitting diode (LED) D connected to the thin film transistor Tr.

The substrate 110 may include, but is not limited to, glass, thin flexible material and/or polymer plastics. For example, the flexible material may be selected from the group, but is not limited to, consisting of polyimide (PI), polyethersulfone (PES), polyethylenenaphthalate (PEN), polyethylene terephthalate (PET), polycarbonate (PC) and a combination thereof. The substrate 110, over which the thin film transistor Tr and the LED D are arranged, forms an array substrate.

A buffer layer 122 may be disposed over the substrate 110, and the thin film transistor Tr is disposed over the buffer layer 122. The buffer layer 122 may be omitted.

A semiconductor layer 120 is disposed over the buffer layer 122. In one exemplary aspect, the semiconductor layer 120 may include, but is not limited to, oxide semiconductor materials. In this case, a light-shied pattern may be disposed under the semiconductor layer 120, and the light-shield pattern can prevent light from being incident toward the semiconductor layer 120, and thereby preventing the semiconductor layer 120 from being deteriorated by the light. Alternatively, the semiconductor layer 120 may include polycrystalline silicon. In this case, opposite edges of the semiconductor layer 120 may be doped with impurities.

A gate insulating layer 124 made of an insulating material is disposed on the semiconductor layer 120. The gate insulating layer 124 may include, but is not limited to, an inorganic insulating material such as silicon oxide (SiOx) or silicon nitride (SiNx).

A gate electrode 130 made of a conductive material such as a metal is disposed over the gate insulating layer 124 so as to correspond to a center of the semiconductor layer 120. While the gate insulating layer 124 is disposed over a whole area of the substrate 110 in FIG. 1, the gate insulating layer 124 may be patterned identically as the gate electrode 130.

An interlayer insulating layer 132 made of an insulating material is disposed on the gate electrode 130 with covering over an entire surface of the substrate 110. The interlayer insulating layer 132 may include, but is not limited to, an inorganic insulating material such as silicon oxide (SiOx) or silicon nitride (SiNx), or an organic insulating material such as benzocyclobutene or photo-acryl.

The interlayer insulating layer 132 has first and second semiconductor layer contact holes 134 and 136 that expose both sides of the semiconductor layer 120. The first and second semiconductor layer contact holes 134 and 136 are disposed over both sides of the gate electrode 130 with spacing apart from the gate electrode 130. The first and second semiconductor layer contact holes 134 and 136 are formed within the gate insulating layer 124 in FIG. 1. Alternatively, the first and second semiconductor layer contact holes 134 and 136 are formed only within the interlayer insulating layer 132 when the gate insulating layer 124 is patterned identically as the gate electrode 130.

A source electrode 144 and a drain electrode 146, each of which includes a conductive material such as a metal, are disposed on the interlayer insulating layer 132. The source electrode 144 and the drain electrode 146 are spaced apart from each other with respect to the gate electrode 130, and contact both sides of the semiconductor layer 120 through the first and second semiconductor layer contact holes 134 and 136, respectively.

The semiconductor layer 120, the gate electrode 130, the source electrode 144 and the drain electrode 146 constitute the thin film transistor Tr, which acts as a driving element. The thin film transistor Tr in FIG. 1 has a coplanar structure in which the gate electrode 130, the source electrode 144 and the drain electrode 146 are disposed over the semiconductor layer 120. Alternatively, the thin film transistor Tr may have an inverted staggered structure in which a gate electrode is disposed under a semiconductor layer and source and drain electrodes are disposed over the semiconductor layer. In this case, the semiconductor layer may include, but is not limited to, amorphous silicon.

Although not shown in FIG. 1, a gate line and a data line, which cross each other to define a pixel region, and a switching element, which is connected to the gate line and the data line, may be further formed in the pixel region. The switching element is connected to the thin film transistor Tr, which is a driving element. In addition, a power line is spaced apart in parallel from the gate line or the data line, and the thin film transistor Tr may further includes a storage capacitor configured to constantly keep a voltage of the gate electrode for one frame.

Moreover, the light emitting display device 100 may include a color filter that comprises dyes or pigments for transmitting light of specific wavelength of light emitted from the LED D. For example, the color filter can transmit light of the specific wavelength such as red (R), green (G), blue (B) and/or white (W). Each of red, green, and blue color filter may be formed separately in each pixel region. In this case, the light emitting display device 100 can implement full-color through the color filter.

For example, when the light emitting display device 100 is a bottom-emission type, the color filter may be disposed on the interlayer insulating layer 132 with corresponding to the LED D. Alternatively, when the light emitting display device 100 is a top-emission type, the color filter may be disposed over the LED D, that is, a second electrode 230.

In addition, the light emitting display device 100 may further comprise a color conversion film which transforms a specific wavelength of light among the light emitted from the LED D. The color conversion film may comprise an inorganic luminescent material such as a quantum dot and/or a quantum rod. For example, the color conversion film may be disposed over the LED D or under the LED D.

A passivation layer 150 is disposed on the source and drain electrodes 144 and 146 over the whole substrate 110. The passivation layer 150 has a flat top surface and a drain contact hole 152 that exposes the drain electrode 146 of the thin film transistor Tr. While the drain contact hole 152 is disposed on the second semiconductor layer contact hole 136, it may be spaced apart from the second semiconductor layer contact hole 136.

The LED D includes a first electrode 210 that is disposed on the passivation layer 150 and connected to the drain electrode 146 of the thin film transistor Tr. The LED D further includes an emissive layer 220 and a second electrode 230 each of which is disposed sequentially on the first electrode 210.

The first electrode 210 is disposed in each pixel region. The first electrode 210 may be an anode and include a conductive material having a relatively high work function value. For example, the first electrode 210 may include, but is not limited to, a doped or undoped metal oxide such as indium-tin-oxide (ITO), indium-zinc-oxide (IZO), indium-tin-zinc oxide (ITZO), indium-copper-oxide (ICO), tin oxide ($SnO_2$), indium oxide ($In_2O_3$), cadmium:zinc oxide (Cd:ZnO), fluorine:tin oxide (F:$SnO_2$), indium:tin oxide (In:$SnO_2$), gallium:tin oxide (Ga:$SnO_2$) or aluminum:zinc oxide (Al:ZnO; AZO). Optionally, the first electrode 210 may include a metal or nonmetal material such as nickel (Ni), platinum (Pt), gold (Au), silver (Ag), iridium (Ir) or a carbon nanotube (CNT), other than the above-described metal oxide.

In one exemplary aspect, when the light emitting display device 100 is a top-emission type, a reflective electrode or a reflective layer (not shown) may be disposed under the first electrode 210. For example, the reflective electrode or the reflective layer (not shown) may comprise, but is not limited to, aluminum-palladium-copper (APC) alloy.

In addition, a bank layer 160 is disposed on the passivation layer 150 in order to cover edges of the first electrode 210. The bank layer 160 exposes a center of the first electrode 210.

An emissive layer 220 is disposed on the first electrode 210. In one exemplary aspect, the emissive layer 220 may have a mono-layered emitting material layer (EML) 240 and a charge control layer (CCL) 260. Alternatively, the emissive layer 220 may have a multiple-layered structure of an EML 240, a first charge transfer layer 250, a second charge transfer layer 270, a CCL 260, and optionally an electron blocking layer (EBL) 280 (see, FIG. 2). In one exemplary aspect, the emissive layer 220 may have one emitting unit. Alternatively, the emissive layer 220 may have multiple emitting units to form a tandem structure.

The second electrode 230 is disposed over the substrate 110 above which the emissive layer 220 is disposed. The second electrode 230 may be disposed over a whole display area, may include a conductive material having a relatively low work function value compared to the first electrode 210, and may be a cathode. For example, the second electrode 230 may include, but is not limited to, Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg.

In addition, an encapsulation film 170 may be disposed over the second electrode 230 in order to prevent outer moisture from penetrating into the LED D. The encapsulation film 170 may have, but is not limited to, a laminated structure of a first inorganic insulating film 172, an organic insulating film 174 and a second inorganic insulating film 176.

Moreover, a polarizer may be attached to the encapsulation film 170 in order to decrease external light reflection. For example, the polarizer may be a circular polarizer. In addition, a cover window may be attached to the encapsulation film 170 or the polarizer. In this case, the substrate 110 and the cover window may have a flexible property, thus the light emitting display device 100 may be a flexible display device.

As described below, the LED D comprises the CCL 260 that is disposed adjacently to the EML 240 and made of metal (see, FIGS. 2 and 5) so that charges can be injected into the EML 240 in balance and it can prevent charges from being leaked into the second charge transfer layer 270.

[Light Emitting Diode]

Figure 2:
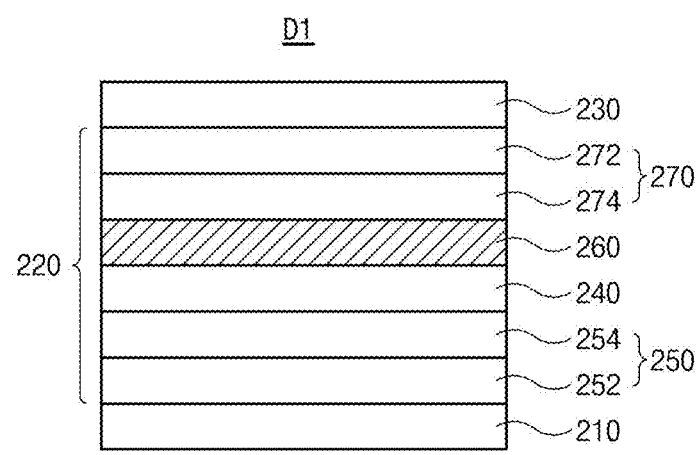
FIG. 2 is a schematic cross-sectional view illustrating a light emitting diode in accordance with one exemplary aspect of the present disclosure.

FIG. 2 is a cross-sectional view illustrating a light emitting diode in accordance with one exemplary aspect of the present disclosure. As illustrated in FIG. 2, the light emitting diode (LED) D1 comprises a first electrode 210, a second electrode 230 facing the first electrode 210 and an emissive layer 220 disposed between the first and second electrodes 210 and 230. The emissive layer 220 comprises an EML 240 disposed between the first and second electrodes 210 and 230. Also, the emissive layer 220 includes a first charge transfer layer (CTL1) 250 disposed between the first electrode 210 and the EML 240, a second charge transfer layer (CTL2) 270 disposed between the EML 240 and the second electrode 230, and a charge control layer (CCL) 260 disposed between the EML 240 and the CTL2 270.

In this aspect, the first electrode 210 may be an anode such as a hole injection electrode. The first electrode 210 may be located over a substrate 110 (see, FIG. 1) that may be a glass or a polymer. As an example, the first electrode 210 may include, but is not limited to, a doped or undoped metal oxide such as ITO, IZO, ITZO, ICO, $SnO_2$, $In_2O_3$, Cd:ZnO, F:$SnO_2$, In:$SnO_2$, Ga:$SnO_2$ and AZO. Optionally, the first electrode 210 may include a metal or nonmetal material such as Ni, Pt, Au, Ag, Ir and CNT, other than the above-described metal oxide.

The second electrode 230 may be a cathode such as an electron injection electrode. As an example, the second electrode 230 may include, but is not limited to, Ca, Ba, Ca/Al, LiF/Ca, LiF/Al, $BaF_2$/Al, CsF/Al, $CaCO_3$/Al, $BaF_2$/Ca/Al, Al, Mg, Au:Mg or Ag:Mg. As an example, each of the first electrode 210 and the second electrode 230 may have a thickness of, but is not limited to, about 30 to about 300 nm.

In one exemplary aspect, when the LED D is a bottom emission-type LED, the first electrode 210 may include, but is not limited to, a transparent conductive metal oxide such as ITO, IZO, ITZO or AZO, and the second electrode 230 may include, but is not limited to, Ca, Ba, Ca/Al, LiF/Ca, LiF/Al, BaF2/Al, Al, Mg, or an Ag:Mg alloy.

The EML 240 may include inorganic luminescence particles or organic luminescence material. As an example, the EML 240 may include the inorganic luminescence particles such as quantum dots (QDs) or quantum rods (QRs). QDs or QRs are inorganic luminescence particles each of which emits light as unstable charge excitons shifts from the conduction band energy level to the valence band (VB) energy level. These inorganic luminescence particles have very large extinction coefficient, high quantum yield among inorganic particles and generates strong fluorescence. In addition, these inorganic luminescence particles emit at different luminescence wavelengths as its size, and it is possible to emit lights within the whole visible light spectra so as to implement various colors by adjusting sizes of these inorganic luminescence particles. When these inorganic luminescence particles such as QDs and/or QRs are used as a luminescence material in the EML 240, it is possible to enhance color purity in individual pixel region and to realize White (W) light consisting of red (R), green (G) and blue (B) light having high color purity.

In one exemplary aspect, QDs or QRs may have a single-layered structure. In another exemplary aspect, the inorganic luminescent particles 300 (e.g., QDs or QRs) may have a multiple-layered heterologous structure, i.e. core 310/shell 320 structures, and in this case, the EML 240 may further comprise plural ligands 330a and 330b each of which is bound to a surface of the shell 320 or free from the inorganic luminescent particles 300 (e.g., QDs or QRs) (see, FIG. 3). Each of the core 310 and the shell 320 may have a single layer or multiple layers, respectively. The reactivity of precursors forming the core 310 and/or shell 320, injection rates of the precursors into a reaction vessel, reaction temperature and kinds of ligands 330a and 330b bonded to the outer surface of those inorganic luminescence particles 300 such as QDs or QRs may have affects upon the growth degrees, crystal structures of those inorganic luminescence particles 300. As a result, it is possible to emit lights of various luminescent wavelength ranges, as the energy level bandgap of those inorganic luminescence particles 300 are adjusted.

In one exemplary aspect, the inorganic luminescence particles 300 (e.g. QDs and/or QRs) may have a type I core/shell structure where an energy level bandgap of the core 310 is within an energy level bandgap of the shell 320. In case of using the type I core/shell structure, electrons and holes are transferred to the core 310 and recombined in the core 310. Since the core 310 emits light from exciton energies, it is possible to adjust luminance wavelengths by adjusting sizes of the core 310.

In another exemplary aspect, the inorganic luminescence particles 300 (e.g. QDs and/or QRs) may have a type II core/shell structure where the energy level bandgap of the core 310 and the shell 320 are staggered and electrons and holes are transferred to opposite directions among the core 310 and the shell 320. In case of using the type II core/shell structure, it is possible to adjust luminescence wavelengths as the thickness and the energy bandgap locations of the shell 320.

In still another exemplary aspect, the inorganic luminescence particles 300 (e.g. QDs and/or QRs) may have a reverse type I core/shell structure where the energy level bandgap of the core 310 is wider than the energy level bandgap of the shell 320. In case of using the reverse type I core/shell structure, it is possible to adjust luminescence wavelengths as thickness of the shell 320.

As an example, when the inorganic luminescence particles 300 (e.g. QDs and/or QRs) has a type-I core/shell structure, the core 310 is a region where luminescence substantially occurs, and a luminescence wavelength of the inorganic luminescence particle 300 is determined as the sizes of the core 310. To achieve a quantum confinement effect, the core 310 necessarily has a smaller size than the exciton Bohr radius according to material of the inorganic luminescence particle 300, and an optical bandgap at a corresponding size.

The shell 320 of the inorganic luminescence particles 300 (e.g. QDs and/or QRs) promotes the quantum confinement effect of the core 310, and determines the stability of the particles 300. Atoms exposed on a surface of colloidal inorganic luminescence particles 300 (e.g. QDs and/or QRs) having only a single structure have lone pair electrons which do not participate in a chemical bond, unlike the internal atoms. Since energy levels of these surface atoms are between the conduction band edge and the valence band edge of the inorganic luminescence particles 300 (e.g. QDs and/or QRs), the charges may be trapped on the surface of the inorganic luminescence particles 300 (e.g. QDs and/or QRs), and thereby resulting in surface defects. Due to a non-radiative recombination process of excitons caused by the surface defects, the luminous efficiency of the inorganic luminescence particles 300 may be degraded, and the trapped charges may react with external oxygen and compounds, leading to a change in the chemical composition of the inorganic luminescence particles 300, or to a permanent loss of the electrical/optical properties of the inorganic luminescence particles 300.

To effectively form the shell on the surface of the core 310, a lattice constant of the material in the shell 320 needs to be similar to that of the material in the core 310. As the surface of the core 310 is enclosed by the shell 320, the oxidation of the core 310 may be prevented, the chemical stability of the inorganic luminescence particles 300 (e.g. QDs and/or QRs) may be enhanced, and the photo-degradation of the core 310 by an external factor such as water or oxygen may be prevented. In addition, the loss of excitons caused by the surface trap on the surface of the core 310 may be minimized, and the energy loss caused by molecular vibration may be prevented, thereby enhancing the quantum efficiency.

In one exemplary aspect, each of the core 310 and the shell 320 may include, but is not limited to, a semiconductor nanocrystal and/or metal oxide nanocrystal having quantum confinement effect. For example, the semiconductor nanocrystal of the core 310 and the shell 320 may be selected from the group, but is not limited to, consisting of Group II-VI compound semiconductor nanocrystal, Group III-V compound semiconductor nanocrystal, Group IV-VI compound semiconductor nanocrystal, Group compound semiconductor nanocrystal and a combination thereof.

Particularly, Group II-VI compound semiconductor nanocrystal of the core 310 and/or the shell 320 may be selected from the group, but is not limited to, consisting of MgS, MgSe, MgTe, CaS, CaSe, CaTe, SrS, SrSe, SrTe, BaS, BaSe, BaTe, ZnS, ZnSe, ZnTe, ZnSeS, ZnTeSe, ZnO, CdS, CdSe, CdTe, CdSeS, CdZnS, CdSeTe, CdO, HgS, HgSe, HgTe, CdZnTe, HgCdTe, HgZnSe, HgZnTe, CdS/ZnS, CdS/ZnSe, CdSe/ZnS, CdSe/ZnSe, ZnSe/ZnS, ZnS/CdSZnS, CdS/CdZnS/ZnS, ZnS/ZnSe/CdSe and a combination thereof. Group III-V compound semiconductor nanocrystal of the core and/or shell may be selected from the group, but is not limited to, consisting of AlN, AlP, AlAs, AlSb, GaN, GaP, GaAs, GaSb, InN, InP, InAs, InSb, AlGaAs, InGaAs, InGaP, AlInAs, AlInSb, GaAsN, GaAsP, GaAsSb, AlGaN, AlGaP, InGaN, InAsSb, InGaSb, AlGaInP, AlGaAsP, InGaAsP, InGaAsSb, InAsSbP, AlInAsP, AlGaAsN, InGaAsN, InAlAsN, GaAsSbN, GaInNAsSb and a combination thereof.

Group IV-VI compound semiconductor nanocrystal of the core 310 and/or shell 320 may be selected from the group, but is not limited to, consisting of $TiO_2$, $SnO_2$, SnS, $SnS_2$, SnTe, PbO, $PbO_2$, PbS, PbSe, PbTe, PbSnTe and combination thereof. Also, Group compound semiconductor nanocrystal of the core 310 and/or shell 320 may be selected from the group, but is not limited to, consisting of $AgGaS_2$, $AgGaSe_2$, $AgGaTe_2$, $AgInS_2$, $CuInS_2$, $CuInSe_2$, $Cu_2SnS_3$, $CuGaS_2$, $CuGaSe_2$ and a combination thereof. Alternatively, each of the core 310 and the shell 320 may independently include multiple layers each of which has different Groups compound semiconductor nanocrystal, e.g., Group II-VI compound semiconductor nanocrystal and Group III-V compound semiconductor nanocrystal such as InP/ZnS, InP/ZnSe, GaP/ZnS, and the likes, respectively.

In another aspect, the metal oxide nanocrystal of the core 310 and/or shell 320 may include, but is not limited to, Group II or Group III metal oxide nanocrystal. As an example, the metal oxide nanocrystal of the core 310 and/or the shell 320 may be selected from the group, but is not limited to, consisting of MgO, CaO, SrO, BaO, $Al_2O_3$ and a combination thereof.

The semiconductor nanocrystal of the core 310 and/or the shell 320 may be doped with a rare earth element such as Eu, Er, Tb, Tm, Dy or an arbitrary combination thereof or may be doped with a metal element such as Mn, Cu, Ag, Al or an arbitrary combination thereof.

As an example, the core 310 in the inorganic luminescent particles 300 (e.g., QDs or QRs) may include, but is not limited to, ZnSe, ZnTe, CdSe, CdTe, InP, ZnCdS, CuxIn1-xS, CuxIn1-xSe, AgxIn1-xS and a combination thereof. The shell 320 in the inorganic luminescent particles 300 (e.g., QDs or QRs) may include, but is not limited to, ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS, CdXZn1-xS and a combination thereof.

In another exemplary aspect, the inorganic luminescence particle 300 may include, but is not limited to, alloy QD or alloy QR such as homogenous alloy QD or QR or gradient alloy QD or QR, e.g. CdSxSe1-x, CdSexTe1-x, CdXZn1-xS, ZnxCd1-xSe, CuxIn1-xS, CuxIn1-xSe, AgxIn1-xS.

In another exemplary aspect, the inorganic luminescence particle 300 may be QDs or QRs having a Perovskite structure. The inorganic luminescence particle such as QDs or QRs of the Perovskite structure comprises a core as a luminescent component and optionally a shell. As an example, the core 310 of the inorganic luminescence particle 300 having the Perovskite structure may have the following structure of Chemical Formula 1:

$ABX_3$         [Chemical Formula]1

In Chemical Formula 1, A is an organic ammonium or alkali metal; B is a metal selected from the group consisting of divalent transition metal, rare earth metal, alkaline earth metal, Pb, Sn, Ge, Ga, In, Al, Sb, Bi, Po and a combination thereof and X is halogen selected from the group consisting of Cl, Br, I and a combination thereof.

For example, when the A is an organic ammonium, the inorganic luminescence particle 300 constitutes an inorganic-organic hybrid Perovskite structure. The organic ammonium may comprise, but is not limited to, amidinium-based organic ion, $(CH_3NH_3)_n$, $((C_xH_{2x+1})_nNH_3)_2(CH_3NH_3)_n$, $(C_nH_{2n+1}NH_3)_2$, $(CF_3NH_3)$, $(CF_3NH_3)_n$, $((C_xF_{2x+1})_nNH_3)_2(CF_3NH_3)_n$, $((C_xF_{2x+1})_nNH_3)_2$ and/or $(C_nF_{2n+1}NH_3)_2$)(each of n and x is independently an integer equal to or more than 1, respectively). More specifically, the organic ammonium may be methyl ammonium or ethyl ammonium.

In addition, the alkali metal of the A may comprise, but is not limited to, Na, K, Rb, Cs and/or Fr. In this case, the inorganic luminescence particle constitutes an inorganic metal Perovskite structure.

For example, when the core 310 of the inorganic luminescence particle 300 having Perovskite structure is the inorganic-organic hybrid Perovskite structure, the inorganic-organic hybrid Perovskite structure has a layered structure in which an inorganic plane in which a metal cation is located is sandwiched between organic planes in which the organic cations are located. In this case, since the difference between the dielectric constant of the organic and inorganic materials is large, exciton is constrained in the inorganic plane constituting the inorganic-organic hybrid Perovskite lattice structure, and thus has the advantage of emitting light having high color purity. Also, when the core 310 of the inorganic luminescence particle 300 having Perovskite structure has the inorganic-organic hybrid Perovskite structure, it may be advantageous in terms of material stability.

By adjusting the composition ratio of each component, the kind and composition ratio of halogen (X) atom in the core 310 of the inorganic luminescence particle 300 having the Perovskite structure, it is possible to synthesize the core emitting light in various wavelengths. In addition, unlike the cores constituting other QDs or QRs, the inorganic luminescence particle 300 having the Perovskite structure has a stable lattice structure, and thus luminous efficiency can be improved.

When the EML 240 includes inorganic luminescence particles such as QDs and/or QRs, the EML 240 may be laminated through solution process, i.e. coating the dispersion solution which contains inorganic luminescence particles 300 dissolved in a solvent, on the CTL1 250 and evaporating the solvent. The EML 240 may be laminated on the CTL1 250 using any solution process such as spin coating, drop coating, dip coating, spray coating, roll coating, flow coating casting, screen printing and inkjet printing, or a combination thereof.

In one exemplary aspect, the EML 240 may include inorganic luminescence particles 300 such as QDs and/or QRs having photoluminescence (PL) wavelength peaks of 440 nm, 530 nm, and 620 nm so as to realize white LED. Optionally, the EML 240 may include inorganic luminescence particles 300 such as QDs or QRs having any one of red, green and blue colors, and may be formed to emit any one color.

In this aspect, the CTL1 250 may be a hole transfer layer which provides holes with the EML 240. As an example, the CTL1 250 may include a hole injection layer (HIL) 252 disposed adjacently to the first electrode 210 between the first electrode 210 and the EML 240, and a hole transport layer (HTL) 254 disposed adjacently to the EML 240 between the first electrode 210 and the EML 240.

The HIL 252 facilitates the injection of holes from the first electrode 210 into the EML 240. As an example, the HIL 252 may include, but is not limited to, an organic material selected from the group consisting of poly(ethylenedioxythiophene):polystyrenesulfonate (PEDOT:PSS); 4,4',4"-tris (diphenylamino)triphenylamines (TDATA) doped with tetrafluoro-tetracyano-quinodimethane (F4-TCNQ); p-doped phthalocyanine such as zinc phthalocyanine (ZnPc) doped with F4-TCNQ; N,N'-diphenyl-N,N'-bis(1-naphthyl)-1,1'-biphenyl-4,4"-diamine (α-NPD) doped with F4-TCNQ; hexaazatriphenylene-hexanitrile (HAT-CN); and a combination thereof. As an example, the HIL 252 may include the dopant such as F4-TCNQ in about 1 to about 30% by weight. The HIL 252 may be omitted in compliance with a structure of the LED D1.

The HTL 254 transports holes from the first electrode 210 into the EML 240. The HTL 254 may include an inorganic material or an organic material. As an example, when the HTL 254 includes an organic material, the HTL 254 may include, but is not limited to, 4,4'-bis(p-carbazolyl)-1,1'-biphenyl compounds such as 4,4'-bis(N-carbazolyl)-1,1'-biphenyl (CBP) and 4,4'-bis(9-carbazolyl)-2,2'-dimethylbiphenyl (CDBP); aromatic amines, i.e. aryl amines or polynuclear aromatic amines selected from the group consisting of α-NPD, N4,N4'-di(naphthalene-1-yl)-N4,N4'-bis (4-vinylphenyl)biphenyl-4,4'-diamine (VNPB), N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N, N'-diphenylbenzidine (DNTPD), N,N'-Bis(3-methylphenyl)-N,N'-bis(phenyl)-9,9'-dioctylfluorene (DOFL-TPD), N2,N7-Di(naphthalene-1-yl)-9,9-dioctyl-N2,N7-diphenyl-9H-fluorene-2, 7-diamine (DOFL-NPB), N4,N4'-Bis(4-(6-((3-ethyloxetan-3-yl)methoxy)hexyl)phenyl)-N4,N4'-diphenylbiphenyl-4,4'-diamine (OTPD), tris(4-carbazolyl-9-ylphenyl)amine (TCTA), tetra-N-phenylbenzidine (TPB), tris(3-methylphenylphenylamino)-triphenylamine (m-MTDATA), poly(9,9'-dioctylfluorenyl-2,7-diyl)-co-(4,4'-(N-(4-sec-butylphenyl)diphenylamine (TFB), poly(4-butylphenyl-dipnehyl amine) (poly-TPD) and a combination thereof; conductive polymers such as polyaniline, polypyrrole, PEDOT:PSS; PVK and its derivatives; poly(para)phenylene vinylenes (PPV) and its derivatives such as poly[2-methoxy-5-(2-ethylhexyloxy)-1,4-phenylene vinylene] (MEH-PPV), poly[2-methoxy-5-(3',7'-dimethyloctyloxy)-1,4-phenylene vinylene] (MOMO-PPV); polymethacrylate and its derivatives; poly(9,9-octylfluorene) and its derivatives; poly(spirofluorene) and its derivatives; metal complexes such as copper phthalocyanine (CuPc); and a combination thereof.

Alternatively, when the HTL 254 includes an inorganic material, the HTL 254 may comprise an inorganic material selected from the group consisting of a metal oxide nanocrystal, a non-oxide metal nanocrystal and combination thereof. The metal oxide nanocrystal that can be used in the HTL 254 may be selected from, but is not limited to, the group consisting of ZnO, $TiO_2$, CoO, CuO, $Cu_2O$, FeO, $In_2O_3$, MnO, NiO, PbO, SnOx, $Cr_2O_3$, $V_2O_5$, $Ce_2O_3$, MoO, $Bi_2O_3$, $ReO_3$ and combination thereof. The non-oxide metal nanocrystal may comprise, but is not limited to, CuSCN, $Mo_2S$ and p-type GAN. Alternatively, the metal oxide and/or the non-oxide metal nanocrystal in the HTL 254 may be doped with a p-dopant. As an example, the p-dopant may be selected from, but is not limited to, the group consisting of $Li^+$, $Na^+$, $K^+$, $Sr^+$, $Ni^{2+}$, $Mn^{2+}$, $Pb^{2+}$, $Cu^+$, $Cu^{2+}$, $Co^{2+}$, $Al^{3+}$, $Eu^{3+}$, $In^{3+}$, $Ce^{3+}$, $Er^{3+}$, $Tb^{3+}$, $Nd^{3+}$, $Y^{3+}$, $Cd^{2+}$, $Sm^{3+}$, N, P, As and a combination thereof.

In FIG. 2, while the CTL1 250 is divided into the HIL 252 and the HTL 254, the CTL1 250 may have a mono-layered structure. For example, the CTL1 250 may include only the HTL 254 without the HIL 252 or may include the above-mentioned hole transporting material doped with the hole injection material (e.g. PEDOT:PSS).

The CTL1 250 including the HIL 252 and the HTL 254 may be laminated by any vacuum deposition process such as vacuum vapor deposition and sputtering, or by any solution process such as spin coating, drop coating, dip coating, spray coating, roll coating, flow coating, casting, screen printing and inkjet printing, or a combination thereof. For example, each of the HIL 252 and the HTL 254 may have a thickness, but is not limited to, between about 10 nm and 200 nm, alternatively, about 10 nm and 100 nm.

The CTL2 270 is disposed between the EML 240 and the second electrode 230. The CTL2 270 may be an electron transfer layer which provides electrons into the EML 240. In one exemplary aspect, the CTL2 270 may include an electron injection layer (EIL) 272 disposed adjacently to the second electrode 230 between the second electrode 230 and the EML 240, and an electron transport layer (ETL) 274 disposed adjacently to the EML 240 between the second electrode 230 and the EML 240.

The EIL 272 facilitates the injection of electrons from the second electrode 230 into the EML 240. For example, the EIL 272 may include, but is not limited to, a metal such as Al, Cd, Cs, Cu, Ga, Ge, In and/or Li, each of which is undoped or doped with fluorine; and/or metal oxide such as $TiO_2$, ZnO, $ZrO_2$, $SnO_2$, $WO_3$ and/or $Ta_2O_3$, each of which is undoped or doped with Al, Mg, In, Li, Ga, Cd, Cs or Cu.

The ETL 274 transfers electrons into the EML 240 and comprises an inorganic material or an organic material. In one exemplary aspect, when the EML 240 includes inorganic luminescence particles, the ETL 274 may include an inorganic material so as to prevent an interface defect from being formed at an interface between the EML 240 and the ETL 274, and thereby securing driving stability of the LED D1. In addition, when the ETL 274 includes an inorganic material having high charge mobility, the electron transport rate provided from the second electrode 230 may be improved, and electrons can be transported efficiently into the EML 240 owing to high electron levels or concentrations.

Moreover, when the EML 240 includes an inorganic luminescence particle 300, the inorganic luminescence particle 300 typically has a very deep VB (valence band) energy level compared to the VB energy level of the organic luminescence material 300. In one exemplary aspect, the ETL 274 may include an inorganic material having relatively deep VB energy level compared to VB energy level of the luminescence material in the EML 240 (see, FIG. 4). As an example, an inorganic material having wide energy level bandgap (Eg) between the VB energy level and a conduction band (CB) energy level may be used as an electron transporting material of the ETL 274. In this case, electrons can be efficiently injected into the EML 240 from the second electrode 230 via the ETL 274.

In one exemplary aspect, the ETL 274 may comprise, but is not limited to, an inorganic material such as a metal oxide nanocrystal, a semiconductor nanocrystal, a nitride and/or combination thereof. For Example, the ETL 274 may comprise the metal oxide nanocrystal.

As an example, the metal oxide nanocrystal in the ETL 274 may comprise, but is not limited to, an oxide nano particle of a metal component selected from the group consisting of Zn, Ca, Mg, Ti, Sn, W, Ta, Hf, Al, Zr, Ba and a combination thereof. More particularly, the metal oxide in the ETL 274 may comprise, but is not limited to, $TiO_2$, $ZnO$, $ZnMgO$, $ZnCaO$, $ZrO_2$, $SnO_2$, $SnMgO$, $WO_3$, $Ta_2O_3$, $HfO_3$, $Al_2O_3$, $BaTiO_3$, $BaZrO_3$ and combination thereof. The semiconductor nanocrystal in the ETL 274 may comprise, but is not limited to CdS, ZnSe, ZnS, and the like, the nitride in the ETL 274 may comprise, but is not limited to, $Si_3N_4$.

Figure 4:
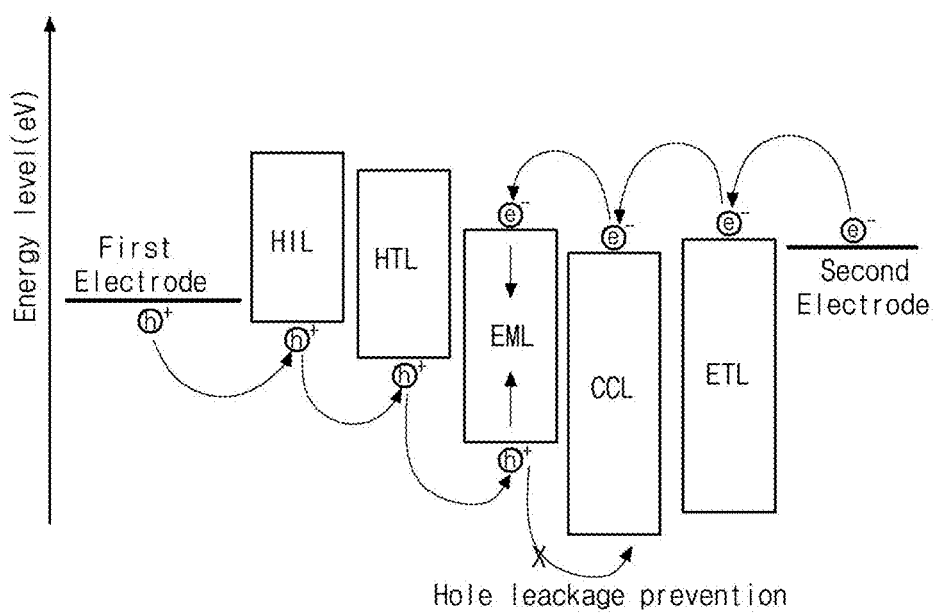
FIG. 4 is a schematic diagram illustrating HOMO (conduction band) and LUMO (valence band) energy levels among materials in the emissive layer and electrodes in accordance with one exemplary aspect of the present disclosure.

In one exemplary aspect, as illustrated in FIG. 4, the ETL 274 may be designed to have the CB energy level substantially equal to the CB energy level of the EML 240 while the VB energy level of the ETL 274 is deeper than the VB energy level of the EML 240.

Similar to the CTL1 250, while FIG. 2 illustrates the CTL2 270 as a bi-layered structure including the EIL 272 and the ETL 274, the CTL2 270 may have a mono-layered structure having only the ETL 274. Alternatively, the CTL2 270 may have a mono-layered structure of ETL 274 including a blend of the above-described electron-transporting inorganic material with cesium carbonate.

The CTL2 270, which includes the EIL 272 and/or the ETL 274 having the inorganic material, may be laminated on the EML 240 by any vacuum deposition process such as vacuum vapor deposition and sputtering, or solution process such as spin coating, drop coating, dip coating, spray coating, roll coating, flow coating, casting, screen printing and inkjet printing, or a combination thereof. As an example, each of the EIL 272 and the ETL 274 may have a thickness, but is not limited to, between about 10 nm and about 200 nm, alternatively, about 10 nm and 100 nm.

For example, the LED D1 may have a hybrid CTL structure in which the HTL 254 of the CTL1 250 includes the organic material as describe above and the CTL2 270, for example, the ETL 274 includes the inorganic material as described above. In this case, The LED D1 may enhance its luminous properties.

Figure 3:
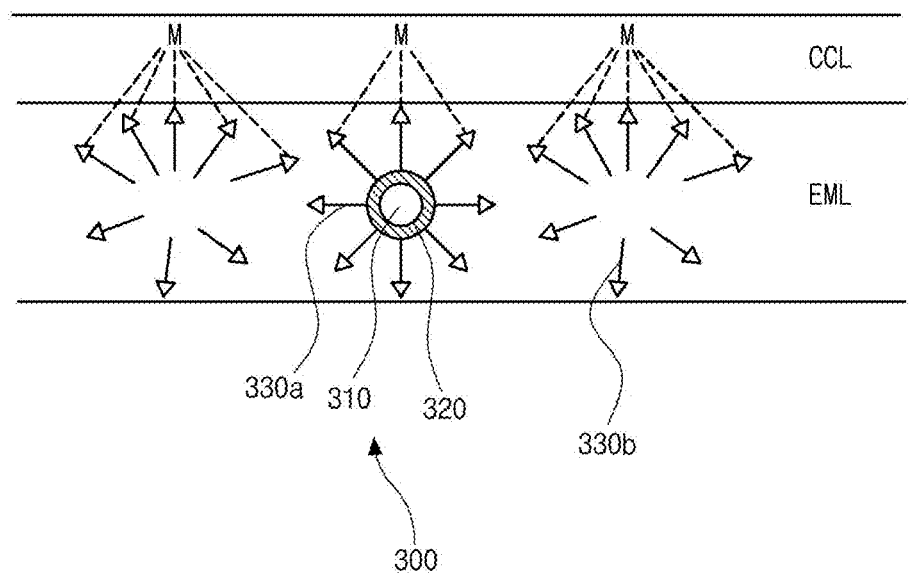
FIG. 3 is a schematic diagram illustrating an interaction between an inorganic luminescence particle in the EML and a metal in the CCL disposed adjacently to the EML.

The LED D1 comprises the CCL 260 made of a metal component M and disposed between the EML 240 and the CTL2 270. The metal component M in the CCL 260 may interact with the ligand 330a that is bound to the surface of the inorganic luminescence particles 300, or with the ligand 330b free from the inorganic luminescent particles 300 in the EML 240. For example, each of the ligands 330a and 330b is coordinated with the metal component M in the CCL 260. In this case, the CCL 260 may be anchored with a surface of the EML 240. FIG. 3 is a schematic diagram illustrating an interaction between the inorganic luminescent particle in the EML 240 and the metal in the CCL 260.

As described above, the inorganic luminescent particles 300 (e.g. QDs and/or QRs) may have a heterologous structure of the core 310 and the shell 320 enclosing the core 310, and comprise the ligand 330a bound to the surface of the shell 320. When the EML 240 including the inorganic luminescence particles 300 is fabricated using the solution process, some of the ligand 330a bound to the surface of the shell 320 is detached, thus the ligand 330b free from the inorganic luminescence particles 300 may be existed in the EML 240. The metal M in the CCL 260 may electrically interact with or coordinated with the end portion of the ligand 330a bound to the surface of the inorganic luminescence particles 300 and/or the ligand 330b free from the inorganic luminescence particles 300. As a result, the CCL 260 may be one surface of the EML 240.

In one exemplary aspect, each of the ligands 330a and 330b may be independently an organic ligand having a negative charge (−), that is, an X-type ligand at one or more terminals thereof. For example, the X-type ligand having the negative charge may be bound to a surface of the metal M in the CCL 260 through a negative charge group selected from the group consisting of a carboxylate group (—COO−), a phosphonate group (—P(OR)$_3$) and a thiolate group (—RS) (for example, R is hydrogen, $C_1$-$C_{20}$ aliphatic hydrocarbon, $C_6$-$C_{30}$ aromatic group or a $C_3$-$C_{30}$ hetero aromatic group). For example without limitation, the X-type ligand 330a or 330b having the negative charge may be bound to the surface of the metal M though the terminal carboxylate group. In this case, the negatively charged group, for example, the carboxylate group, in the X-type ligand 330a or 330b may electrically interact with the metal M in the CCL 260.

As an example, each of the ligands 330a and 330b having the terminal carboxylate group may be derived from, but is not limited to, a saturated or unsaturated $C_5$-$C_{30}$ aliphatic carboxylic acid, preferably a saturated or unsaturated $C_8$-$C_{20}$ aliphatic carboxylic acid. More particularly, each of the ligands 330a and 330b having the terminal carboxylate group may be derived from a saturated or unsaturated aliphatic carboxylic acid such as octanoic acid $CH_3(CH_2)_6COOH$), decanoic acid ($CH_3(CH_2)_8COOH$), dodecanoic acid (or lauric acid, $CH_3(CH_2)_{10}COOH$), 1-tetradicanoic acid (or myristic acid, $CH_3(CH_2)_{12}COOH$), n-hexadecanoic acid (or palmitic acid, $CH_3(CH_2)_{14}COOH$), n-octadecanoic acid (or stearic acid, $CH_3(CH_2)_{16}COOH$), cis-9-octadecenoic acid (or oleic acid, $CH_3(CH_2)_7CH=CH(CH_2)_7COOH$).

In an alternative aspect, each of the ligands 330a and 330b may be an organic ligand bound to the surface of the metal M through lone pair electrons, that is, an L-type ligand. Each of the organic ligands 330a and 330b having the lone pair electrons may interact with the metal by coordinating with the metal M through the lone pair electrons of the group selected from an amino group (—$NR_2$), a thiol group (—SH), a phosphine group (—$PR_3$) and a phosphine oxide group (—$POR_3$) (for example, R is hydrogen, $C_1$-$C_{30}$ aliphatic hydrocarbon, $C_6$-$C_{30}$ aromatic group or a $C_3$-$C_{30}$ hetero aromatic group). As an example, when the organic ligand 330a or 330b has a terminal amino group including the lone pair electrons, the nitrogen atom in the amino group is strongly bonded to the metal M in the CCL by the coordination bonds between the nitrogen atom and the metal M.

For example, each of the organic ligands 330a and 330b having the lone pair electrons may be selected from, but is not limited to, the group consisting of $C_1$-$C_{10}$ alkyl amine (e.g. primary, secondary or tertiary alkyl amine), preferably linear or branched $C_1$-$C_5$ alkyl amine; $C_4$-$C_8$ alicyclic amine, preferably $C_5$-$C_8$ alicyclic amine; $C_5$-$C_{20}$ aromatic amine, preferably $C_5$-$C_{10}$ aromatic amine; linear or branched $C_1$-$C_{10}$ alkyl phosphine (e.g. primary, secondary or tertiary alkyl phosphine), preferably linear or branched $C_1$-$C_5$ alkyl phosphine; linear or branched $C_1$-$C_{10}$ alkyl phosphine oxide (e.g. primary, secondary or tertiary alkyl phosphine oxide), preferably linear or branched $C_1$-$C_5$ alkyl phosphine oxide and a combination thereof.

In one exemplary aspect, the organic ligand having the lone pair electrons may comprise, but is not limited to, tertiary amines such as tris(2-aminoethy)amine (TAEA) and tris(2-aminomethyl)amine; alkyl polyamines such as N-butyl-N-ethylethane-1,2-diamine, ethylene diamine and pentaethylenehexamine); alicyclic amines such as cyclohexane-1,2-diamine and cyclohexene-1,2-diamine; aromatic amines 2,3-diaminopyridine; and a combination thereof.

The CCL 260 prevents holes from leaking into or trapping at the CTL2, for example the ETL 274 and induces holes and electrons to be injected into the EML 240 in a balance manner. FIG. 4 is a schematic diagram illustrating HOMO (or CB) and LUMO (or VB) energy levels among materials in the emissive layer and electrodes in accordance with one exemplary aspect of the present disclosure.

As described above, the ETL 274 including the inorganic material has very deep VB energy level. However, there are numerous hole trap energy levels in the middle of the energy bandgap of the ETL 274 owing to the property of the inorganic materials. Holes injected into the EML 240 may be leaked into or trapped to the ETL through the hole trap energy levels. On the contrary, since the CCL 260, which is made of the metal component and disposed between the EML 240 and the ETL 274, may acts as an energy barrier minimizing hole leakages or hole traps.

In addition, when the ETL 274 is made of the inorganic material, the amount of electrons injected into the EML 240 from the second electrode 230 via the ETL 274 is larger than the amount of holes injected into the EML 240 from the first electrode 210 via the HTL 254, because the electrons in the ETL 274 made of the inorganic material is transported faster than the holes in the HTL 254 made of the organic material. The CCL 260 acts as an electron injection barrier between the ETL 274 and the EML 240 and delays the electron injections toward the EML 240.

Hole leakages or traps between the EML 240 and the ETL 274 may be minimized by applying the CCL 260, thus leakage currents in the LED D1 can be reduced and holes and electrons can be injected into the EML 240 in a balanced manner. Accordingly, the LED D1 can lower its driving voltage and improves its luminous efficiency and luminous lifetime.

In one exemplary aspect, the CCL 260 may be fabricated using solution dissociating an ionic metal compound having the metal component in a solvent, for example a polar solvent such as alcohol (e.g. ethanol). As an example, the metal in the CCL 260 may comprise a post-transition metal. For example, the metal may be a Group 13 metal that can be dissociated into trivalent ion in the solvent. More particularly, the Group 13 metal may be selected from Al, Ga, In, Tl and a combination thereof, preferably Al, Ga, In and a combination thereof. In an alternative aspect, the metal M in the CCL 260 may comprise an alkali metal, an alkaline earth metal, a lanthanide metal and an actinide metal.

As an example, the CCL 260 may be fabricated by applying the solution in which the ionic metal compound is dissociated on the EML 240, and then evaporating or removing the solvent and counter-ionic material to form the CCL 260 made of the metal M. As an example, the CCL may be laminated on the EML 240 using any solution process such as spin coating, drop coating, dip coating, spray coating, roll coating, flow coating casting, screen printing and inkjet printing, or a combination thereof.

In one exemplary aspect, the CCL 260 made of the metal M may have a thickness of, but is not limited to, about 0.1 nm to about 10 nm, preferably about 0.1 nm to about 3 nm. When the thickness of the CCL 260 is larger than 10 nm, the driving voltage of the LED D1 may be raised excessively.

Figure 5:
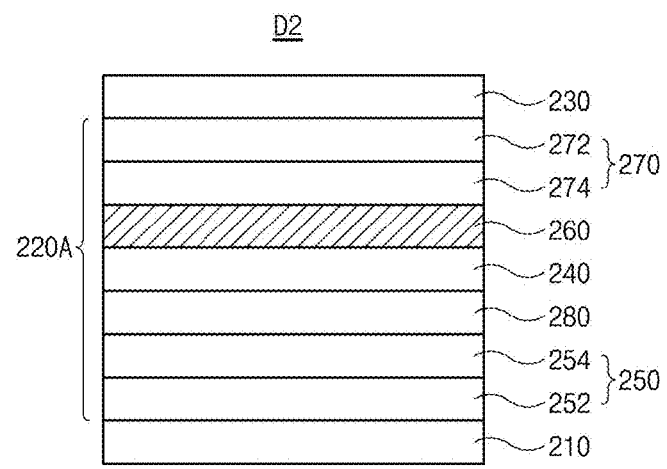
FIG. 5 is a schematic cross-sectional view illustrating a light emitting diode in accordance with another exemplary aspect of the present disclosure.

In the above aspect, the emissive layer comprises the EML, CTLs and CCL. The LED may further comprise an electron blocking layer (EBL) for controlling electron transfer. FIG. 5 is a schematic cross-sectional view illustrating a light emitting diode in accordance with another exemplary aspect of the present disclosure.

As illustrated in FIG. 5, the LED D2 of this aspect comprises the first electrode 210, the second electrode 230 facing the first electrode 210 and an emissive layer 220A disposed between the first and second electrodes 210 and 230. The emissive layer 220A comprises the EML 240. Also, the emissive layer 220A further comprises the CTL1 250 disposed between the first electrode 210 and the EML 240, the CTL2 270 disposed between the EML 240 and the second electrode 230, the CCL 260 disposed between the EML 240 and the CTL2 270, and an EBL 280 disposed between the CTL1 250 and the EML 240. The configurations and materials in the first and second electrodes 210 and 230 as well as the emissive layer 220A except the EBL 280 may be identical to the corresponding layers in the first aspect.

The EBL 280 prevents the electrons transfers between the EML 240 and the CTL1 250, thereby preventing the luminous efficiency and the luminous lifetime of the LED D2 from reducing. As an example, the EBL 280 may comprise, but is not limited to, TCTA, tris[4-(diethylamino)phenyl] amine, N-(biphenyl-4-yl)-9,9-dimethyl-N-(4-(9-phenyl-9H-carbazole-3-yl)phenyl)-9H-fluorene-2-amine, tri-p-tolylamine, 1,1-bis(4-(N,N'-di)ptolyl)amino)phenyl) cyclohexane (TAPC), m-MTDATA, 1,3-bis(N-carbazolyl) benzene (mCP), 3,3'-bis(N-carbazolyl)-1,1'-biphenyl (mCBP), poly-TPD, CuPC, DNTPD, 1,3,5-tris[4-(diphenylamino)phenyl]benzene (TDAPB) and combination thereof.

The LED D2 comprises the CCL 260 between the EML 240 and the CTL2 270, thus hole leakages or traps can be minimized and holes and electrons can be injected into the EML 240 in balance. In addition, the EBL 280 prevents electron from leaking into the CTL1 250. Accordingly, the LED D2 can minimize charge leakages, lower its driving voltages and power consumption, and improve its luminous efficiency and luminous lifetime.

Example 1 (Ex. 1): Fabrication of LED

A quantum light emitting diode (QLED) in which a charge control layer (CCL) made of Indium and disposed between an EML and an ETL was fabricated. An ITO (50 nm)-glass was patterned to have luminous area 3 mm×3 mm and washed. And an emissive layer and cathode were laminated as the following order:

A HIL (PEDOT:PSS, spin coating (2000 rpm, 60 seconds, Clevios P VP AL 4083 (Heraeus company) in water base, and heating (140° C., 30 minutes), 40 nm); a HTL (TFB (3 mg/MIL in toluene), spin coating (5000 rpm, 60 seconds) and heating (210° C., 40 minutes), 15 nm); an EML (green QD InP/ZnSe/ZnS having lauric acid and oleic acid ligands (18 mg/mL in octane), spin coating (3000 rpm, 60 seconds), 25 nm); a CCL ($InCl_3$ (in EtOH, 2 wt %), spin coating (3000 rpm, 60 second) and drying (60° C., 30 seconds), 0.1-3 nm); an ETL (ZnMgO (12 mg/mL in EtOH), spin coating (2000 rpm, 60 seconds) and heating (90° C., 3 minutes), 20 nm); a cathode (Al, deposition at a rate of 2.5 Å/S under $10^{-6}$ torr, 100 nm).

After depositing the cathode, the QLED was encapsulated with glass. And then, the QLED was transferred to dry box for film formation, followed by encapsulation using UV-curable epoxy and moisture getter.

Examples 2-3 (Ex. 2-3): Fabrication of LED

A QLED was fabricated using the same materials as Example 1, except using each of the $GaCl_3$ (Ex. 2) or $AlCl_3$ (Ex. 3) as the starting material for the CCL instead of $InCl_3$.

Comparative Example 1 (Ref. 1: Fabrication of LED

A QLED was fabricated using the same materials as Example 1, except without forming the CCL between the EML and the ETL.

Comparative Example 2-4 (Refs. 2-4: Fabrication of LED

A QLED was fabricated using the same materials as Ref. 1, except using each of ZnMgO doped with $In^{3+}$ by 3-5 wt % (Ref. 2), ZnMgO doped with $Ga^{3+}$ by 3-5 wt % (Ref. 3) or ZnMgO doped with $Al^{3+}$ by 3-5 wt % (Ref. 4) instead of un-doped ZnMgO.

Experimental Example 1: Analysis of CCL Formation

Figure 6:
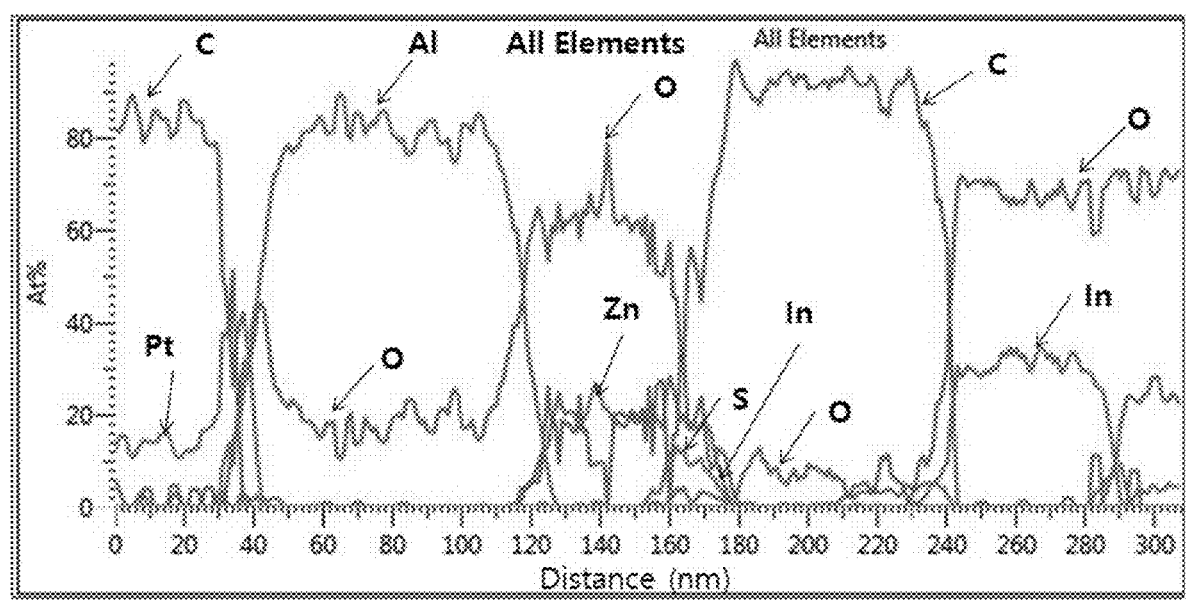
FIG. 6 is a graph illustrating TEM-EDS analysis result for the LED having the CCL fabricated from $In^{3+}$ ion and shows all elements detected in the LED.
Figure 7:
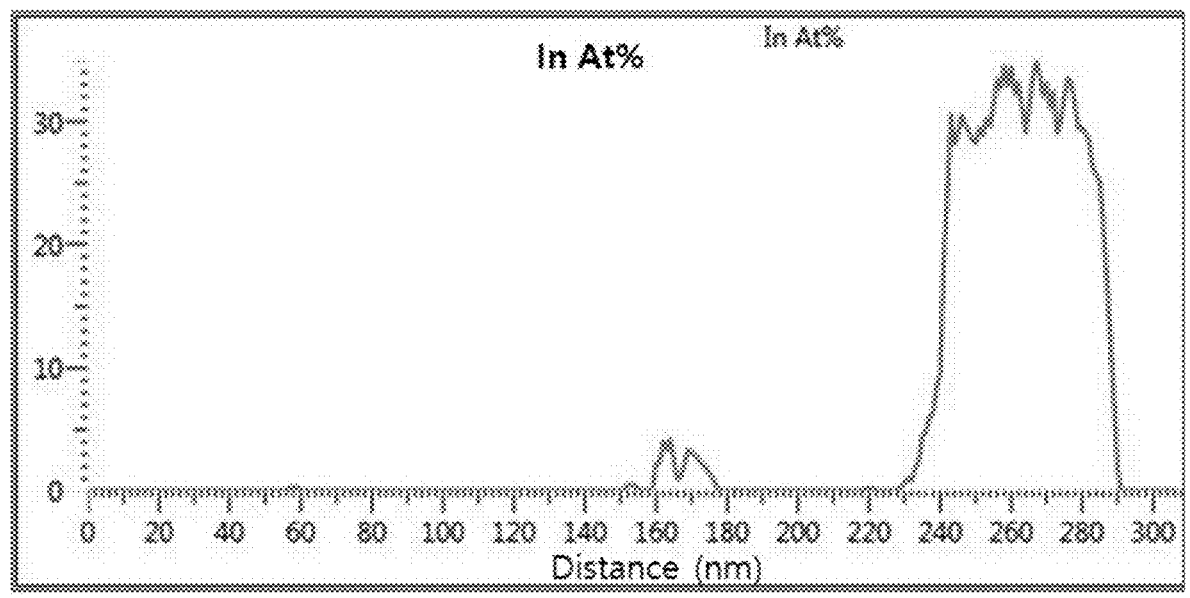
FIG. 7 is a graph illustrating TEM-EDS analysis result for the LED having the CCL fabricated from $In^{3+}$ ion and shows In component among all elements detected in the LED.
Figure 8:
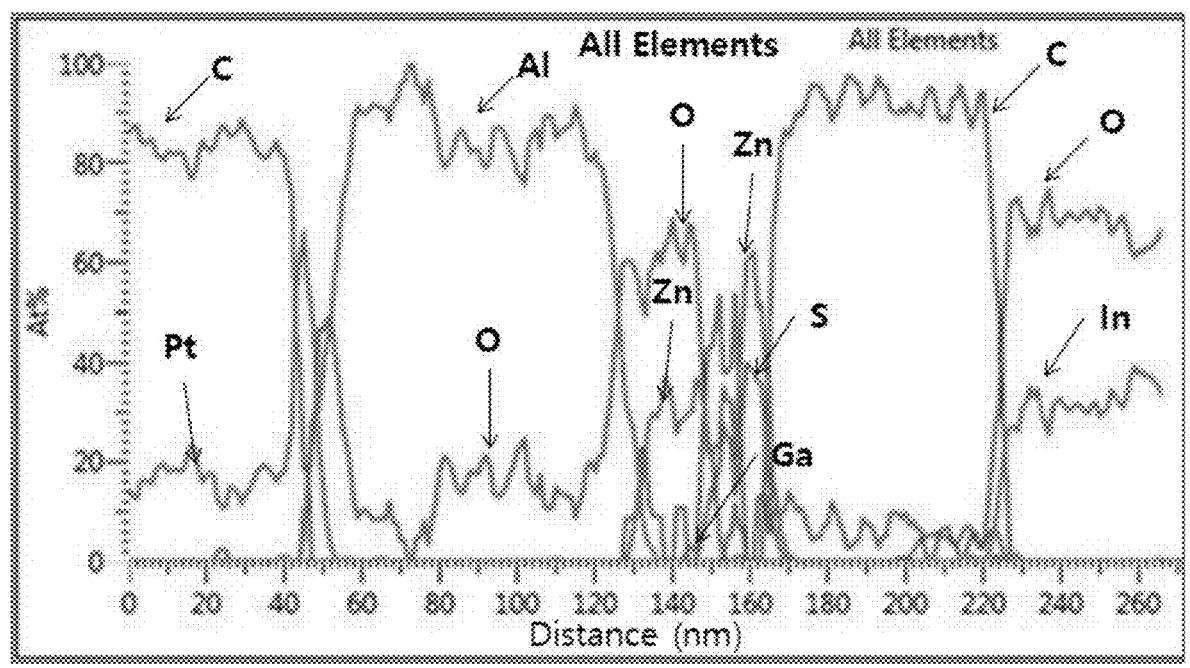
FIG. 8 is a graph illustrating TEM-EDS analysis result for the LED having the CCL fabricated from $Ga^{3+}$ ion and shows all elements detected in the LED.
Figure 9:
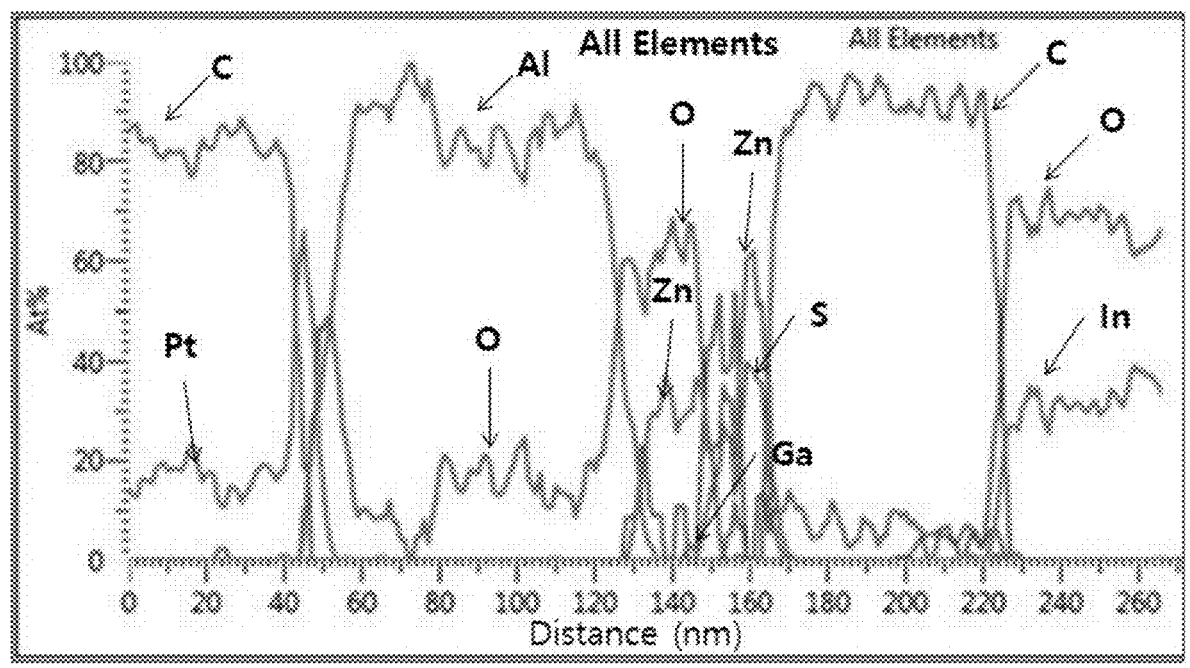
FIG. 9 is a graph illustrating TEM-EDS analysis result for the LED having the CCL fabricated from $Ga^{3+}$ ion and shows Ga component among all elements detected in the LED.
Figure 10:
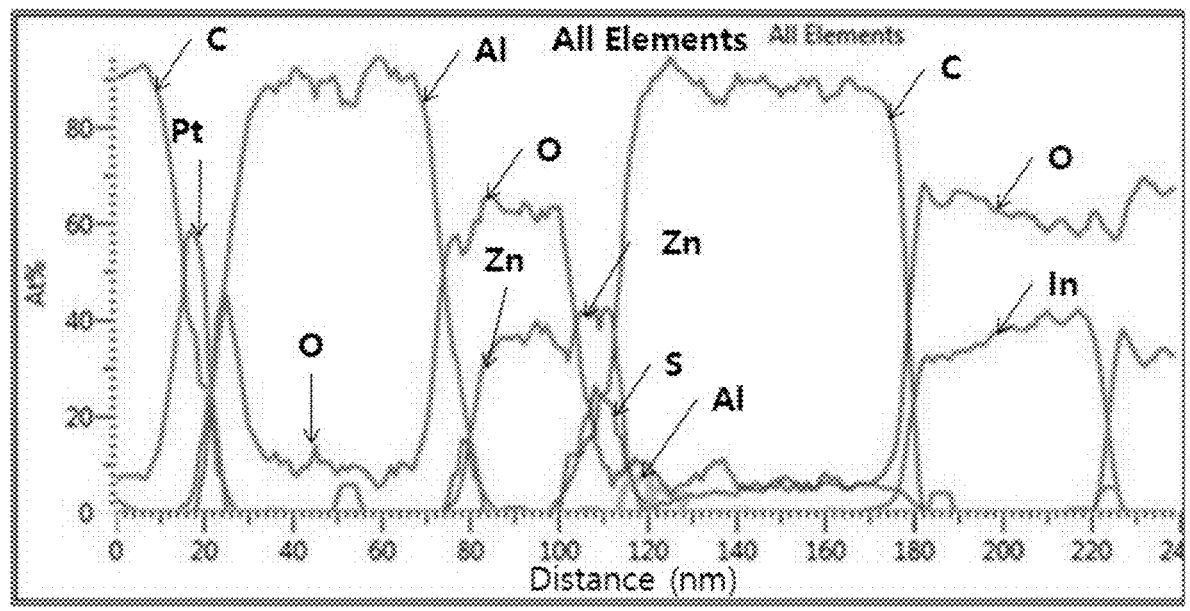
FIG. 10 is a graph illustrating TEM-EDS analysis result for the LED having the CCL fabricated from $Al^{3+}$ ion and shows all elements detected in the LED.
Figure 11:
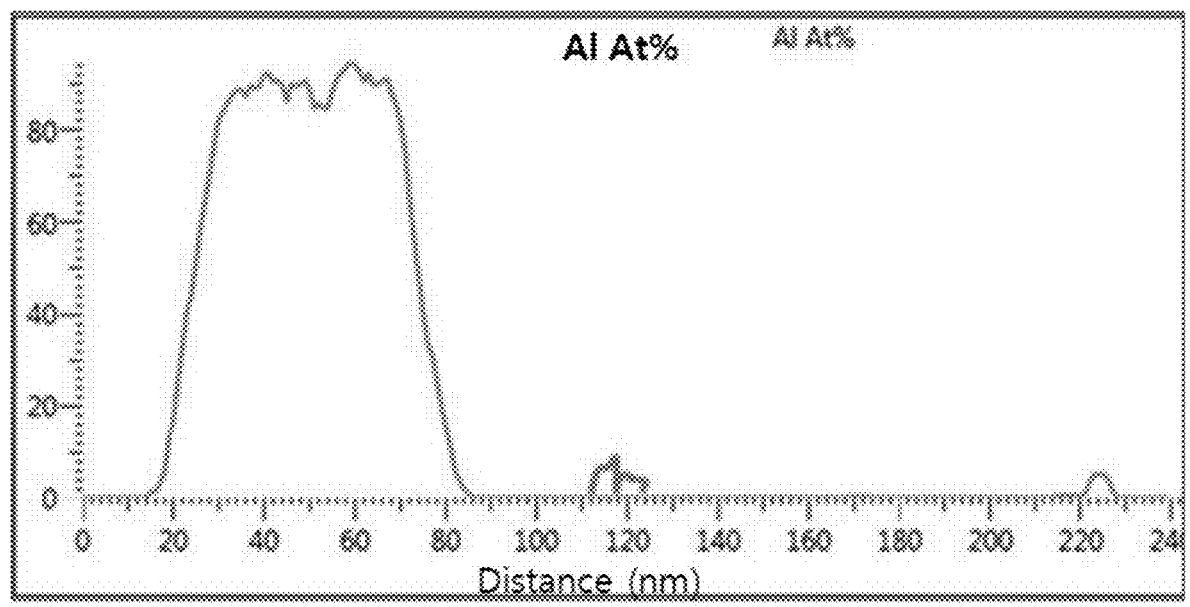
FIG. 11 is a graph illustrating TEM-EDS analysis result for the LED having the CCL fabricated from $Al^{3+}$ ion and shows Al component among all elements detected in the LED.
Figure 12:
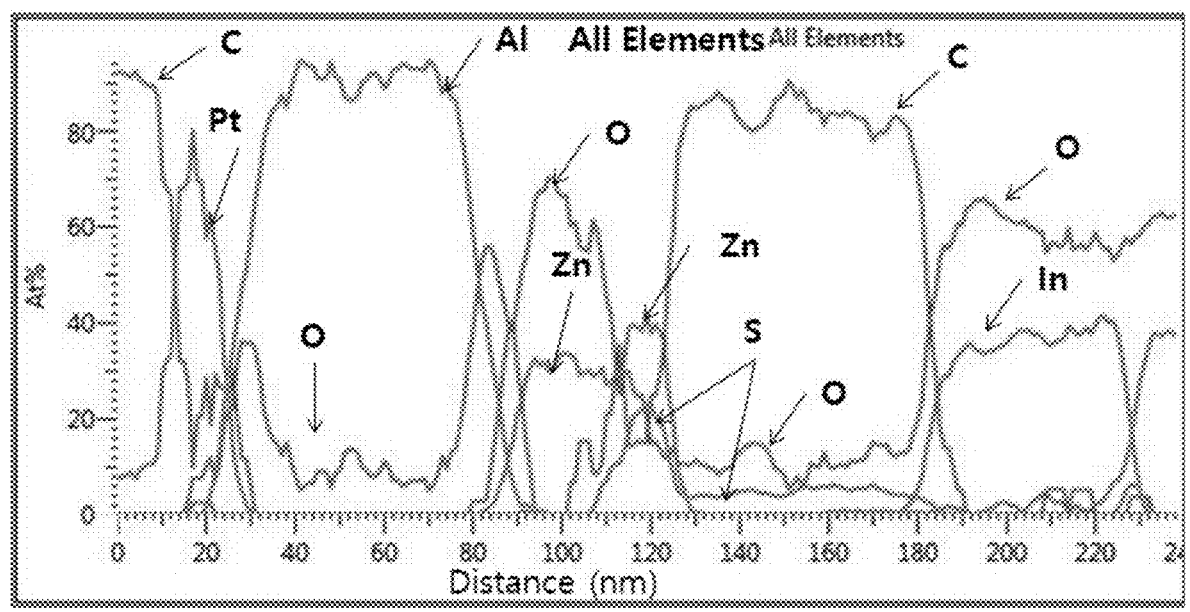
FIG. 12 is a graph illustrating TEM-EDS analysis result for the LED without the CCL.

After decapping the top glass and coating Platinum (Pt) film on the cathode, elements were detected using TEM-EDS analysis by scanning electron beams from the top cathode to the lower substrate in the cross-section of the LEDs fabricated in Ex. 1 to 3 and Ref 1. FIGS. 6 and 7 shows the TEM-EDS analysis results for the LED fabricated in Ex. 1 (Indium was used as the CCL), FIGS. 8 and 9 shows the TEM-EDS analysis results for the LED fabricated in Ex. 2 (Gallium was used as the CCL), FIGS. 10 and 11 shows the TEM-EDS analysis results for the LED fabricated in Ex. 3 (Aluminum was used as the CCL), and FIG. 12 shows the TEM-EDS analysis results for the LED fabricated in Ref 1. As shown in FIGS. 6 to 11, it was confirmed that the each of the QLEDs in Ex. 1 to Ex. 3 comprise the CCL between the EML and the ETL and made of Indium, Gallium or Aluminum.

Experimental Example 2: Evaluation of Luminous Properties of QLED

Each of the QLED fabricated in Ex. 1 to 3 and Refs. 1 to 4 was connected to an external power source and then luminous properties for all the diodes were evaluated using a constant current source (KEITHLEY) and a photometer PR650 at room temperature. In particular, voltage-current density as well as external quantum efficiency (EQE, %), luminance ($cd/m^2$), driving voltage (V), peak wavelength (Wp, nm), full-width half maximum (FWHM, nm) and luminous lifetime ($T_{95}$, $T_{90}$, $T_{50}$, hours) at a current density of 10 J ($mA/cm^2$) of the QLEDs were measured. The results thereof are shown in the following Table 1 and FIGS. 13-16.

TABLE 1

| | Luminous Property of QLED | | | | | |
|---|---|---|---|---|---|---|
| | | | | | luminous lifetime | |
| sample | EQE | cd/m2 | V | $T_{95}$ | $T_{90}$ | $T_{50}$ |
| Ref 1 | 3.3 | 55.9 | 3.57 | 1.4 sec. | 18 sec. | 4 min. and 30 sec. |
| Ref 2 | 5.7 | 109.2 | 4.5 | 1.2 sec. | 12.2 sec. | 5 min. and 43 sec. |
| Ref 3 | 5.3 | 95.9 | 4.1 | 3.0 sec. | 10.2 sec. | 6 min. and 14 sec. |
| Ref 4 | 5.8 | 95.5 | 3.8 | 2.5 sec. | 14.1 sec. | 6 min. and 41 sec. |
| Ex. 1 | 5.3 | 85.2 | 3.5 | 21 sec. | 47 sec. | 2 hour and 15 min. |
| Ex. 2 | 4.9 | 102.2 | 3.8 | 44 sec. | 2 min. | 1 hour and 54 min. |
| Ex. 3 | 4.8 | 113.5 | 4.4 | 20 min. and 30 sec. | 1 hour and 14 min. | 8 hour and 40 min. |

Figure 13:
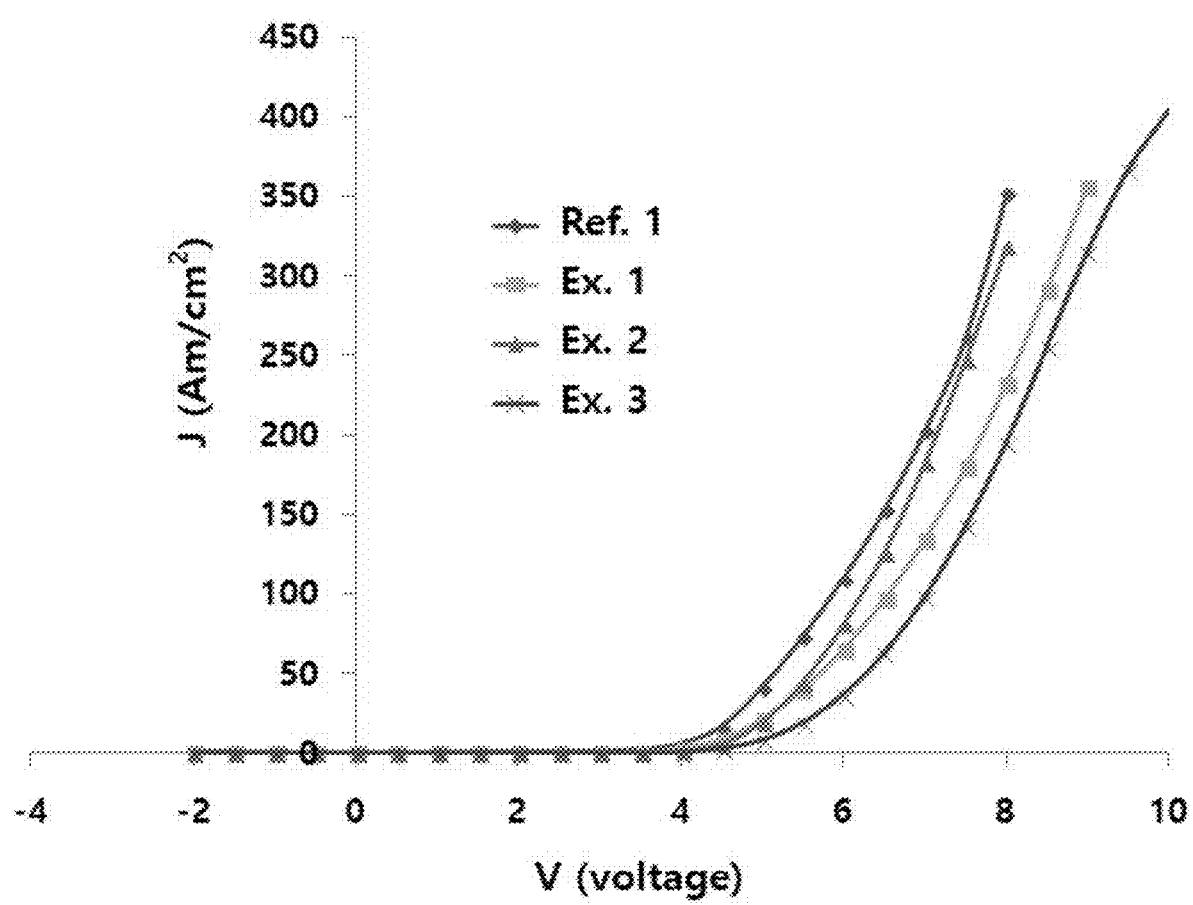
FIG. 13 is a graph illustrating a voltage (V)-current density (J) measurement result of the LED fabricated in accordance with Examples of the present disclosure and shows the current density as a linear scale.
Figure 14:
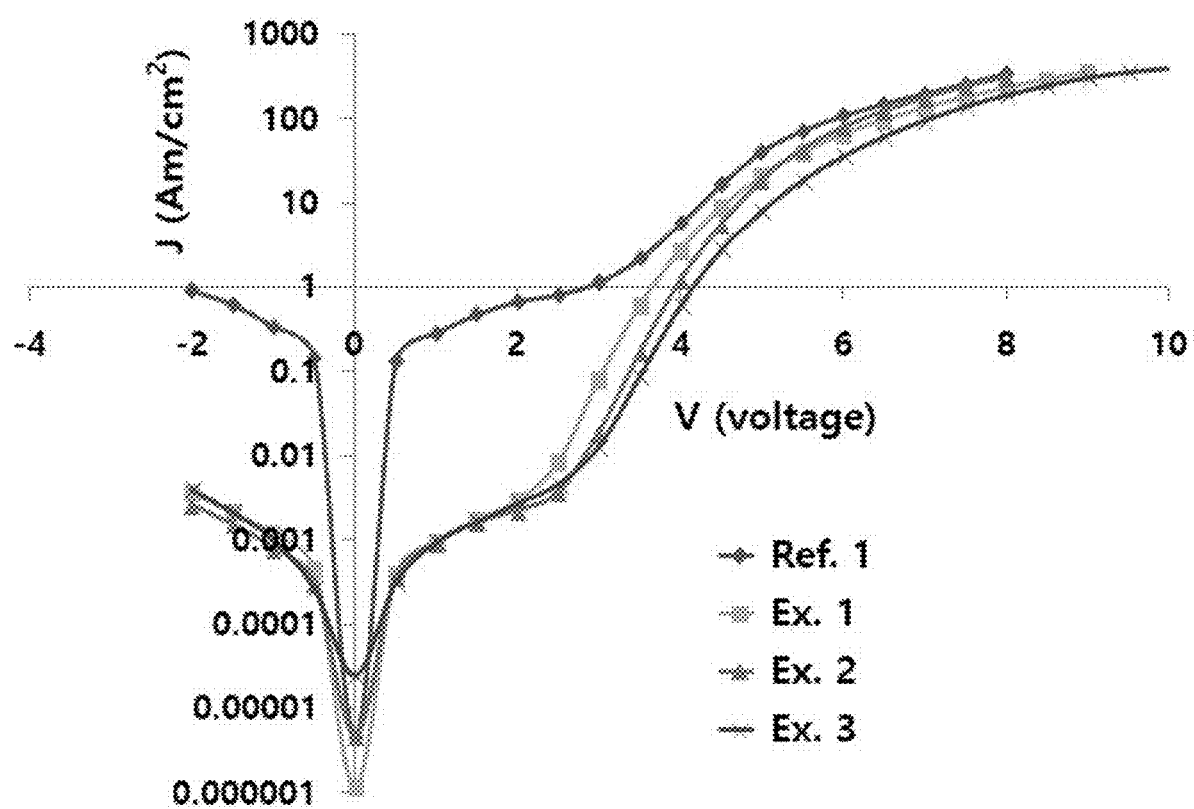
FIG. 14 is a graph illustrating V-J measurement result of the LED fabricated in accordance with Examples of the present disclosure and shows the current density as a log scale.
Figure 15:
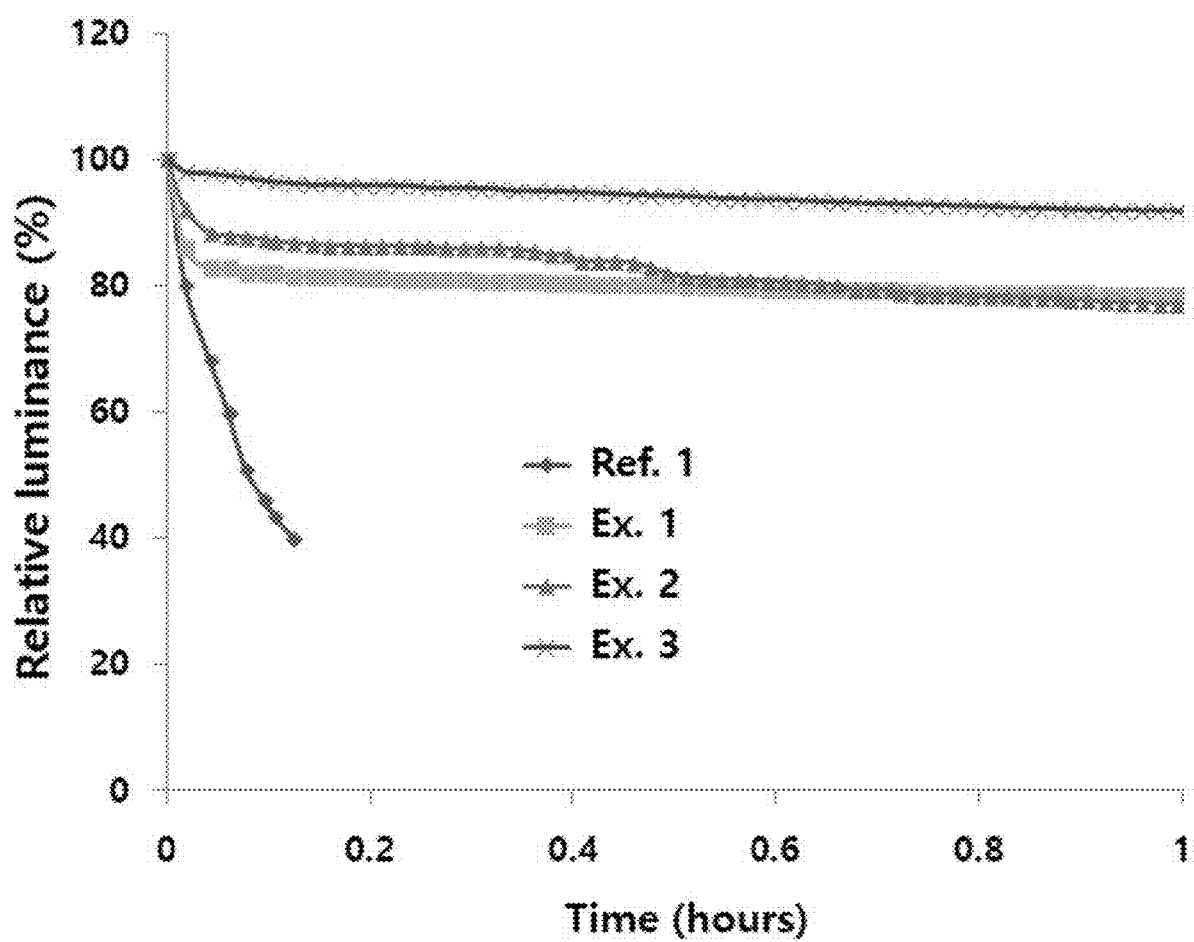
FIG. 15 is a graph illustrating a luminance measurement result over time in the LED fabricated in accordance with Examples of the present disclosure.

As indicated in Table 1 and FIG. 15, compared to the QLED in which the CCL is not introduced in Ref. 1, the QLEDs in which CCLs are introduced between the EML and the ETL in Ex. 1-3 showed identical or a little bit raised driving voltages, but improved their EQE, luminance, luminous lifetime up to 45.5%, 103.0%, 245.7 times ($T_{90}$), respectively. Also, as illustrated in FIGS. 13 and 14, The QLED in Ref. 1 generated much leakage current without driving voltages as holes are leaked or trapped in the ETL while the QLEDs in Ex. 1-3 reduced the leakage current significantly.

Also, compared to the QLED in which the ETL comprises only the inorganic metal oxide in Ref. 1, the QLEDs in which the ETL further comprises metal ions doped to the inorganic metal oxide improved their EQE and luminance, but reduced or increased a little bit their luminous lifetime. Such a result indicates that in case of doping a metal component to an inorganic material in the ETL, holes and electrons may be injected into the EML due to decrease of electron injection velocity, but the electron injection velocity is delayed excessively and holes may be leaked into the ETL.

Experimental Example 3: Interaction Between Metal in CCL and QD Ligand

Figure 16:
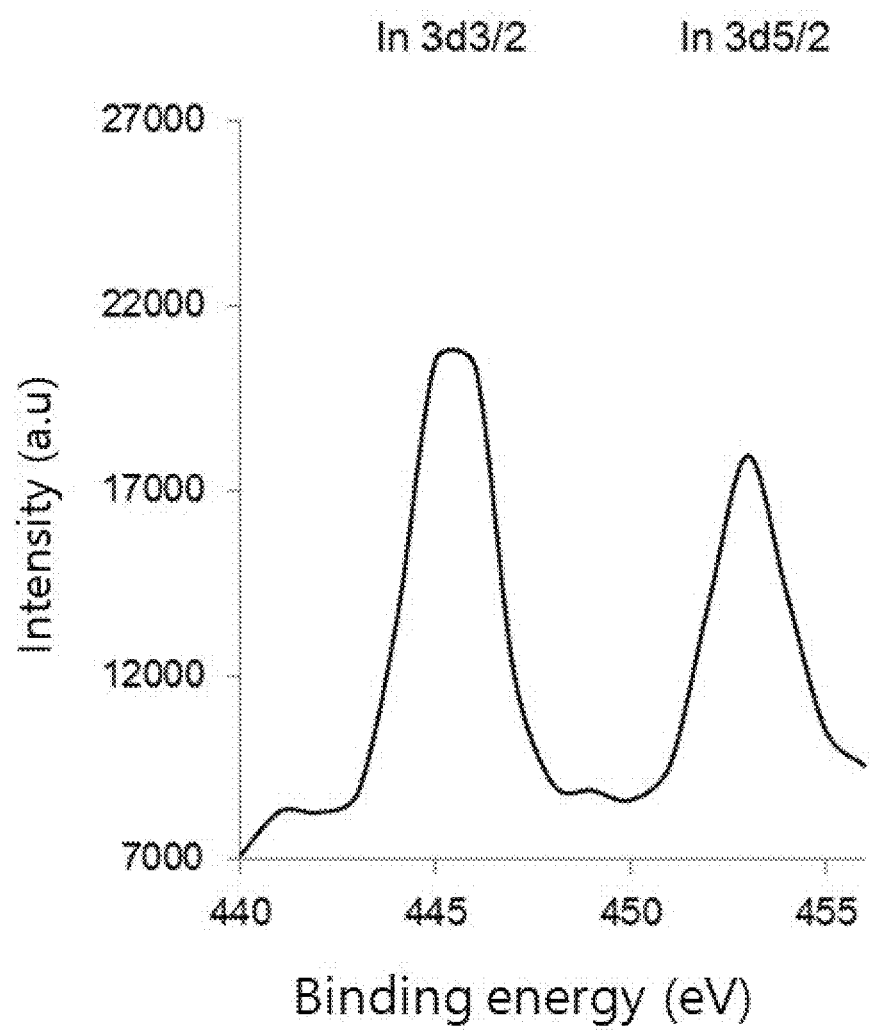
FIG. 16 shows the result on the In-coated thin film.
Figure 17:
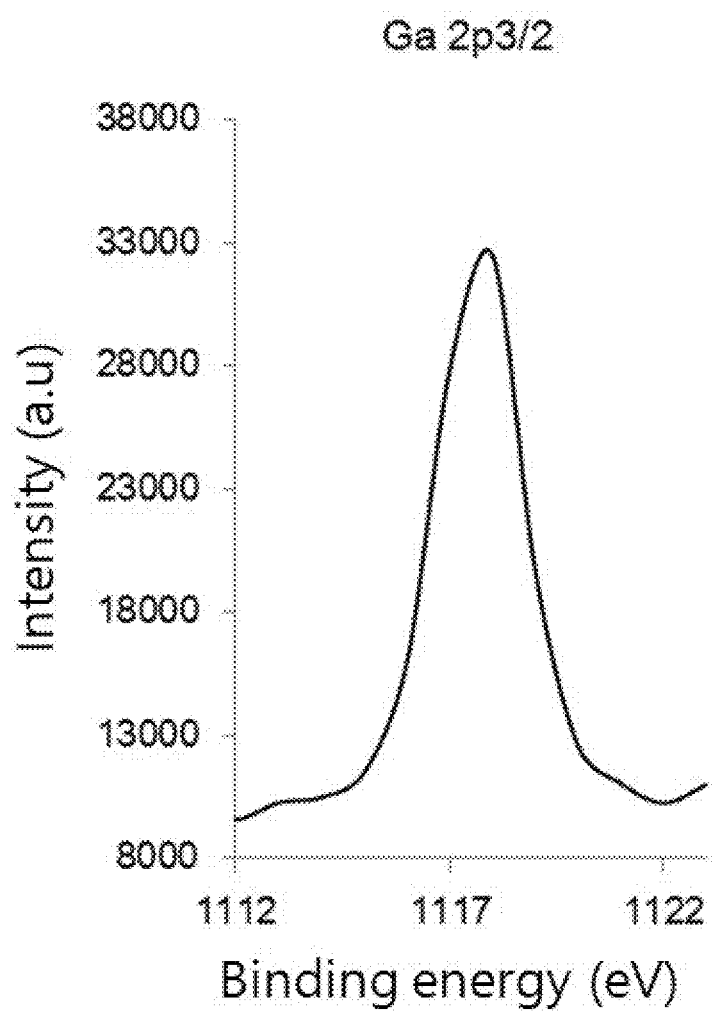
FIG. 17 shows the result on the Ga-coated thin film and FIG. 18 shows the result on the Al-coated thin film.
Figure 18:
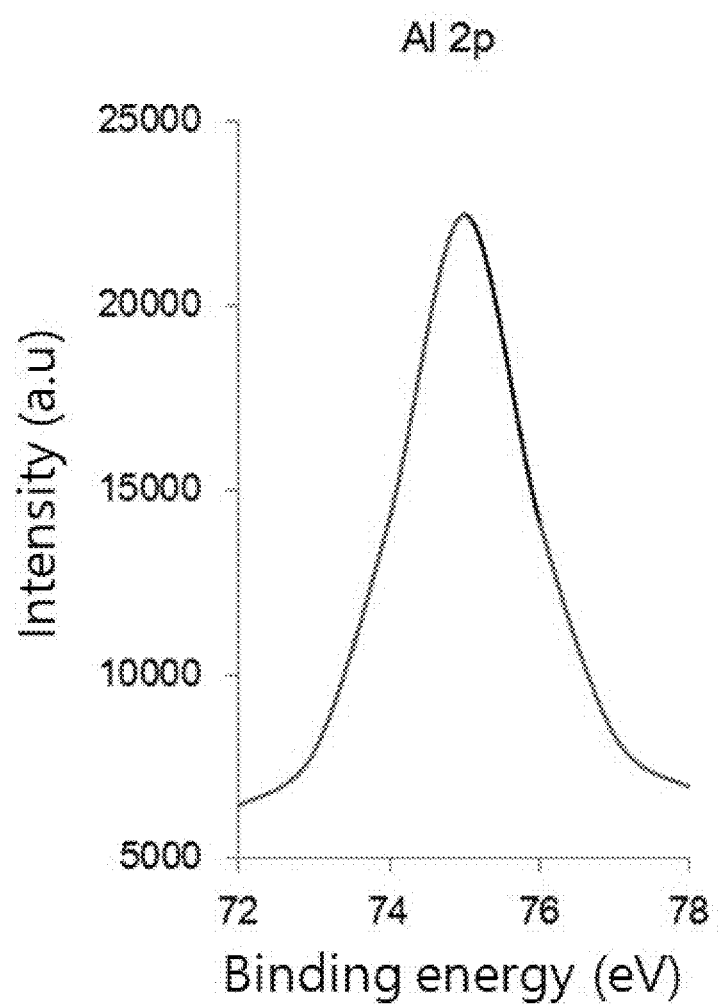

A solution of QD ZnSe/ZnS (18 mg/mL in octane) in which lauric acid and oleic acid ligand was bounded was spin-coated (3000 rpm, 60 seconds) on the wafer substrate to form a QD thin film. And then, a solution of $InCl_3$ (in EtOH, 2 wt %), $GaCl_3$ (in EtOH, 2 wt %) or $AlCl_3$ (in EtOH, 2 wt %) was spin-coated (3000 rpm, 60 seconds) on the QD thin film and dried (60° C., 30 seconds) to form a second CCL thin film made of Indium, Gallium or Aluminum. In order to confirm an interaction between the QD thin film and the CCL thin film among the two-layered thin film, XPS analysis was conducted. FIGS. 16 to 18 illustrate the XPS analysis results for the two-layered thin films. As illustrated in FIGS. 16-18, metal components (Indium, Gallium or Aluminum) bound to oxygen which comprises in the lauric acid and/or the oleic acid ligands were observed. We confirmed that the metal components in the CCL layer interact with oxygen atoms of the carboxylic acid ligands in the QD thin film.

It will be apparent to those skilled in the art that various modifications and variations can be made in the present disclosure without departing from the scope of the invention. Thus, it is intended that the present disclosure cover the modifications and variations of the present disclosure provided they come within the scope of the appended claims.

What is claimed is:

1. A light emitting diode, comprising:
   a first electrode;
   a second electrode facing the first electrode;
   an emitting material layer disposed between the first and second electrodes;
   a charge control layer disposed between the emitting material layer and the second electrode, wherein the charge control layer comprises a metal;
   a first charge transfer layer disposed between the first electrode and the emitting material layer; and
   a second charge transfer layer disposed between the charge control layer and the second electrode.

2. The light emitting diode of claim 1, wherein the metal comprises a post-transition metal, an alkali metal, an alkaline earth metal, a lanthanide metal and an actinide metal.

3. The light emitting diode of claim 1, wherein the metal comprises a Group 13 metal.

4. The light emitting diode of claim 1, wherein the metal comprises Al, Ga, In, Tl or combination thereof.

5. The light emitting diode of claim 1, wherein the charge control layer has a thickness between about 0.1 nm and about 10 nm.

6. The light emitting diode of claim 1, wherein the second charge transfer layer comprises an inorganic material.

7. The light emitting diode of claim 1, wherein the second charge transfer layer comprises a metal oxide.

8. The light emitting diode of claim 1, wherein the second charge transfer layer has a valence band energy level deeper than a valence band energy level of the emitting material layer.

9. The light emitting diode of claim 1, wherein the emitting material layer comprises an inorganic luminescence particle.

10. The light emitting diode of claim 9, wherein the inorganic luminescence particle comprises a quantum dot, a quantum rod or combination thereof.

11. The light emitting diode of claim 9, wherein the inorganic luminescence particle comprises a core, a shell enclosing the core and a first ligand bound to a surface of the shell.

12. The light emitting diode of claim 11, wherein the emitting material layer further comprises a second ligand free from the inorganic luminescence particle.

13. The light emitting diode of claim 11, wherein the metal interacts with the first ligand.

14. The light emitting diode of claim 11, wherein the first ligand comprises an organic ligand having a negative charge.

15. The light emitting diode of claim 14, wherein the organic ligand comprises at least one negatively charged group of a carboxylate group, a phosphonate group, and a thiolate group in at least one terminus thereof.

16. The light emitting diode of claim 11, wherein the first ligand comprises an organic ligand having lone pair electrons.

17. The light emitting diode of claim 16, wherein the organic ligand comprises at least one of an amino group, a thiol group, a phosphine group, and a phosphine oxide group in at least one terminus thereof.

18. The light emitting diode of claim 11, wherein the first ligand is coordinated with the metal.

19. A light emitting device, comprising:
   a substrate; and
   the light emitting diode of claim 1 and disposed over the substrate.

20. A light emitting diode, comprising:
   a first electrode;
   a second electrode facing the first electrode;
   an emitting material layer disposed between the first and second electrode;
   an electron transfer layer disposed between the emitting material layer and the second electrode; and
   a charge control layer disposed between the emitting material layer and the electron transport layer,
   wherein the charge control layer comprises a metal.

* * * * *